(12) United States Patent
Oh

(10) Patent No.: US 11,968,454 B2
(45) Date of Patent: Apr. 23, 2024

(54) SENSOR DRIVING APPARATUS

(71) Applicant: LG INNOTEK CO., LTD., Seoul (KR)

(72) Inventor: Jung Seok Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 116 days.

(21) Appl. No.: 17/757,923

(22) PCT Filed: Dec. 24, 2020

(86) PCT No.: PCT/KR2020/019054
§ 371 (c)(1),
(2) Date: Jun. 23, 2022

(87) PCT Pub. No.: WO2021/133078
PCT Pub. Date: Jul. 1, 2021

(65) Prior Publication Data
US 2023/0023813 A1    Jan. 26, 2023

(30) Foreign Application Priority Data

Dec. 24, 2019  (KR) .................. 10-2019-0173650

(51) Int. Cl.
*H04N 23/68*   (2023.01)
*H04N 23/54*   (2023.01)
*H04N 23/55*   (2023.01)
(52) U.S. Cl.
CPC ........... *H04N 23/687* (2023.01); *H04N 23/54* (2023.01); *H04N 23/55* (2023.01)

(58) Field of Classification Search
CPC ...... H04N 23/54; H04N 23/687; H04N 23/55; H04N 23/57; H04N 23/67; G03B 13/36;
(Continued)

(56) References Cited

U.S. PATENT DOCUMENTS 8,248,497 B2 *  8/2012  Tanimura .................. G03B 5/00
                                                 348/208.99
8,605,160 B2 * 12/2013  Kwon .................. H04N 23/685
                                                 348/208.99
(Continued)

FOREIGN PATENT DOCUMENTS

JP       2019-512734 A    5/2019
JP           S507628 B2    5/2019
(Continued)

OTHER PUBLICATIONS

International Search Report dated Apr. 14, 2021 in International Application No. PCT/KR2020/019054.

*Primary Examiner* — Pritham D Prabhakher
(74) *Attorney, Agent, or Firm* — Saliwanchik, Lloyd & Eisenschenk

(57) ABSTRACT

A sensor driving apparatus according to the embodiment includes a fixed portion including a first substrate; an elastic member disposed on the first substrate; and a sensor moving portion disposed on the elastic member; wherein the elastic member includes: a first insulating portion; a second insulating portion spaced apart from the first insulating portion; and an elastic connection portion connecting the first insulating portion and the second insulating portion; wherein the elastic connection portion electrically connects the fixed portion and the moving portion.

20 Claims, 26 Drawing Sheets

(58) Field of Classification Search
CPC .... G02B 27/646; G02B 7/021; H02K 41/031; H02K 2201/18; H01L 27/14618; H05K 2201/10151; H05K 2201/10121; H05K 1/189
USPC ...................................................... 348/208.7
See application file for complete search history.

(56) References Cited

U.S. PATENT DOCUMENTS

| | | | |
|---|---|---|---|
| 9,420,185 B2* | 8/2016 | Oh | H04N 23/6811 |
| 9,936,134 B2 | 4/2018 | Enta | |
| 10,033,303 B2 | 7/2018 | Liu et al. | |
| 10,516,348 B2* | 12/2019 | Liu | H04N 23/687 |
| 10,795,114 B2* | 10/2020 | Zhu | G02B 7/02 |
| 10,924,675 B2* | 2/2021 | Hubert | H05K 1/165 |
| 10,944,909 B2 | 3/2021 | Enta | |
| 11,199,182 B2* | 12/2021 | Miller | F16F 15/002 |
| 2006/0092514 A1* | 5/2006 | Koo | H04N 23/687 359/557 |
| 2013/0107068 A1* | 5/2013 | Kim | G03B 17/02 348/208.11 |
| 2015/0341534 A1* | 11/2015 | Ng | H04N 25/00 348/208.7 |
| 2017/0133951 A1* | 5/2017 | Liu | H04N 23/687 |
| 2017/0353662 A1* | 12/2017 | Enta | G02B 27/646 |
| 2018/0171991 A1* | 6/2018 | Miller | G02B 27/646 |
| 2019/0141248 A1* | 5/2019 | Hubert | H04N 23/687 |
| 2021/0006720 A1* | 1/2021 | Enta | H04N 23/45 |

FOREIGN PATENT DOCUMENTS

| | | |
|---|---|---|
| KR | 10-2015-0066819 A | 6/2015 |
| KR | 10-2018-0081087 A | 7/2018 |
| KR | 10-2019-0055058 A | 5/2019 |

\* cited by examiner (a)

(b)

(a)

(b)

(a)

(b)

SENSOR DRIVING APPARATUS

CROSS-REFERENCE TO RELATED APPLICATIONS

This application is the U.S. national stage application of International Patent Application No. PCT/KR2020/019054, filed Dec. 24, 2020, which claims the benefit under 35 U.S.C. § 119 of Korean Application No. 10-2019-0173650, filed Dec. 24, 2019, the disclosures of each of which are incorporated herein by reference in their entirety.

TECHNICAL FIELD

An embodiment relates to a sensor driving apparatus, and more particularly, to a sensor driving apparatus capable of relative movement with respect to a lens barrel.

BACKGROUND ART

In general, a camera device is mounted on an automobile, an endoscope, and an electronic device such as a CCTV, in addition to a portable device such as a mobile communication terminal and an MP3 player. Such a camera device has been gradually developed with a focus on high pixels, and has been reduced in size and thickness. Not only that, current camera devices are changing so that a variety of additional functions can be realized at low production costs.

The above-described camera device includes a lens barrel for accommodating a lens, a lens holder coupled with the lens barrel, an image sensor disposed in the lens holder, and a driving substrate on which the image sensor is mounted. In this case, the lens transmits an image signal of a subject to the image sensor. Then, the image sensor converts the video signal into an electric signal.

Here, accuracy of the video signal at the camera device is determined according to a focal length defined as a distance between the lens and the image sensor.

Accordingly, the camera device provided focus correction or shake compensation by moving the lens barrel relative to the image sensor. That is, in the camera device, the lens barrel accommodating the lens was moved relative to the image sensor in an X-axis, a Y-axis, and a Z-axis. At this time, the camera device required at least six elastic members such as springs to relatively move the lens barrel. In addition, each elastic member was coupled with the lens barrel by a method like bonding.

DISCLOSURE

Technical Problem

An embodiment provides a substrate, a sensor driving device, and a camera module including the same having a new structure.

In addition, the embodiment provides a substrate, a sensor driving device, and a camera module including the same that allows the image sensor to move relative to the lens barrel.

In addition, the embodiment provides a substrate, a sensor driving device, and a camera module including the same capable of not only movement of the X-axis, Y-axis and Z-axis, but also tilt correction.

In addition, the embodiment provides a substrate, a sensor driving device and a camera module including the same that can simplify a spring structure for providing an autofocus function and a handshake correction function.

In addition, the embodiment provides a substrate, a sensor driving device, and a camera module including the same capable of suppressing the tilt occurring when the image sensor moves by adding a wire spring to a leaf spring structure serving as an electrical connection with the image sensor.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A sensor driving apparatus according to the embodiment includes a fixed portion including a first substrate; an elastic member disposed on the first substrate; and a sensor moving portion disposed on the elastic member; wherein the elastic member includes: a first insulating portion; a second insulating portion spaced apart from the first insulating portion; and an elastic connection portion connecting the first insulating portion and the second insulating portion; wherein the elastic connection portion electrically connects the fixed portion and the moving portion.

In addition, the elastic member includes a support plate supporting the first insulating portion and the second insulating portion.

In addition, the sensor moving portion includes: a second substrate having an opening formed in a central region; and a coil disposed on the second substrate.

In addition, the sensor moving portion includes: a third substrate disposed under the second substrate and having a terminal portion and an opening formed in a central region.

In addition, the elastic connection portion includes a plurality of elastic connection lines including a first lead pattern connected to the first insulating portion; a second lead pattern connected to the second connection portion, and a connection pattern connecting the first lead pattern and the second lead pattern.

In addition, the first lead pattern of at least one of the plurality of elastic connection lines is disposed on a first side region of the first insulating portion, and the second lead pattern is disposed on a second side region of the second insulating portion that does not correspond to the first side region.

In addition, the connection pattern is bent at least twice.

In addition, each of the plurality of elastic connection lines includes a bending region between the corner region between the first insulating portion and the second insulating portion, and wherein an insulating member connects each of the bending regions.

In addition, the moving portion includes a first driving portion, and wherein the fixed portion includes a base, a holder coupled to the base, and a second driving portion disposed to correspond to the first driving portion.

In addition, the fixed portion includes a damping plate coupled to the holder, and wherein a wire is connected between the damping plate and the moving portion.

In addition, the damping plate includes a hole, and the wire is coupled to the hole of the damping plate.

In addition, the elastic connection portion electrically connects the fixed portion and the moving portion.

On the other hand, the sensor driving apparatus according to the embodiment includes a first substrate; an elastic member disposed on the first substrate; a second substrate disposed on the elastic member; a sensor coupled to the second substrate; a holder disposed on the second substrate; a first driving portion disposed on the second substrate; and a second driving portion corresponding to the first driving portion and coupled to the holder, wherein the elastic member includes a plurality of elastic connection lines, wherein at least one of the plurality of elastic connection lines electrically connects the first substrate and the second substrate, and wherein the sensor is shifted by the first driving portion and the second driving portion.

Effects of the Invention

According to an embodiment, in order to implement the OIS and AF functions of the camera module, the image sensor is moved relative to the lens barrel in the X-axis, Y-axis and Z-axis directions, rather than moving the lens barrel as in the prior art. Accordingly, the camera module according to the embodiment may eliminate a complex spring structure for implementing the OIS and AF functions, and thus the structure may be simplified. In addition, the embodiment moves the image sensor relative to the lens barrel, thereby providing a stable structure compared to the prior art.

In an embodiment, a connection pattern portion of a fourth substrate electrically connecting an image sensor portion and a first substrate is floated and disposed on an insulating layer while having a spring structure. In this case, the connection pattern portion serves as a circuit for transmitting a signal between the image sensor portion and the first substrate and serves as a spring for moving the image sensor included in the image sensor portion based on the X-axis, Y-axis, and Z-axis. Accordingly, the camera module according to the embodiment can remove a structure such as a spring plate required to move the image sensor, and the manufacturing process may be facilitated by excluding the process related to the spring plate.

In addition, when the connection pattern portion having a spring function is disposed, the connection pattern portion does not connect between a first lead pattern portion and a second lead pattern portion disposed in a region opposite to the region where the first lead pattern portion is disposed, but connects between the second lead pattern portion disposed in a region intersecting the region where the first lead pattern portion is disposed. For this reason, the connection pattern portion of the embodiment has a form in which it rotates in a tilting direction of the image sensor and is disposed. Accordingly, the tilt operation of the image sensor in the embodiment can be stably performed using the connection pattern portion.

In addition, the fourth substrate in the embodiment includes an insulating layer and a connection pattern portion disposed on the insulating layer, and the insulating layer includes a third insulating portion disposed in at least a portion of a region that vertically overlaps with the connection pattern portion. Accordingly, the camera module may move the image sensor with respect to the lens barrel while elastically supporting the image sensor more stably.

In addition, the length of the connection pattern portion in the embodiment is to have between at least 1.5 to 20 times a linear distance between the first lead pattern portion and the second lead pattern portion facing each other. Accordingly, it is possible to minimize noise generation while improving the mobility of the image sensor substrate.

In addition, a second actuator of the embodiment includes a connection wire elastically supporting the fourth substrate in addition to a leaf spring structure configured of the connection pattern portion of the fourth substrate. In this case, the connection pattern portion may be disposed in a first direction in the second actuator, and the connection wire may be disposed in a second direction perpendicular to the first direction. The connection wire compensates for the tilting phenomenon in the Z-axis that occurs when the second actuator is driven. That is, the connection wire serves as a support, not as an electrical connection, in the second actuator, and a tilt phenomenon of the image sensor portion in the Z-axis that may occur when the second actuator is driven is suppressed. Accordingly, the connection wire is additionally disposed together with the connection pattern portion of the fourth substrate, thereby suppressing the tilt phenomenon occurring when the image sensor portion moves, and thereby improving operational reliability.

DESCRIPTION OF DRAWINGS

FIG. 7 (b) is a plan view of the first actuator of FIG. 5.

FIG. 8 (b) is a bottom view of the first actuator of FIG. 5.

FIG. 16 (b) is a bottom view of the third substrate of the coil moving substrate portion shown in FIG. 14.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, an embodiment of the present disclosure will be described in detail with reference to the accompanying drawings.

Figure 1:
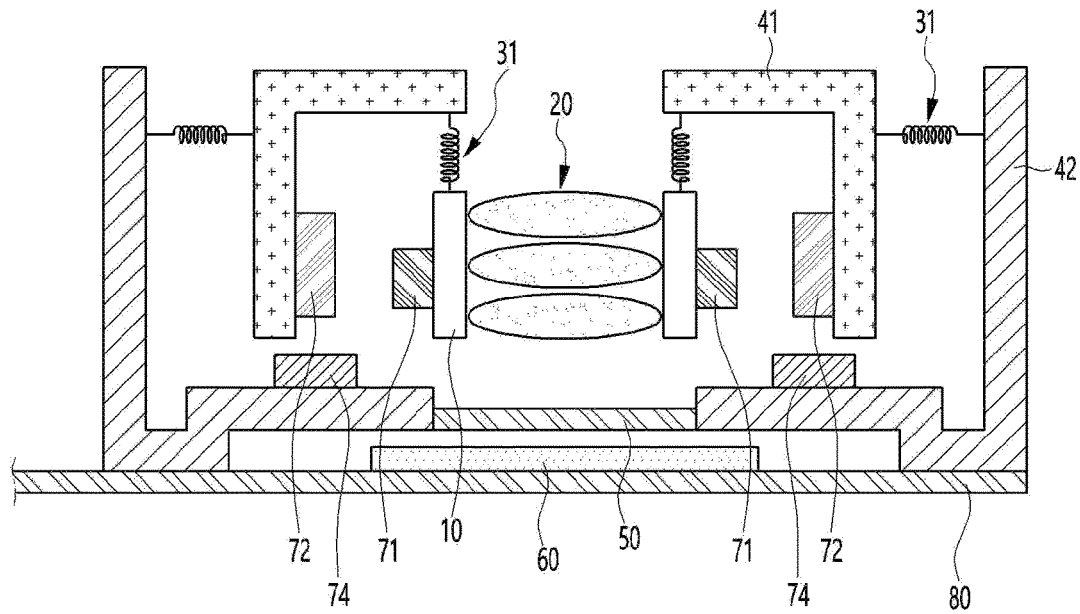
FIG. 1 is a view showing a camera module according to a comparative example.

FIG. 1 is a view showing a camera module according to Comparative Example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and drivers 71, 72, and 73.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, a substrate for an image sensor, a camera module, and a camera device including the same according to an embodiment will be described.

"Optical axis direction" used below is defined as an optical axis direction of a lens and/or an image sensor coupled to a lens driving device.

"Vertical direction" used below may be a direction parallel to the optical axis direction. The vertical direction may correspond to "z-axis direction". "Horizontal direction" used below may be a direction perpendicular to the vertical direction. That is, the horizontal direction may be a direction perpendicular to the optical axis. Therefore, the horizontal direction may include "x-axis direction" and "y-axis direction".

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor. Meanwhile, "auto focus" may correspond to "AF (Auto Focus)".

"Camera shake correction function" used below is defined as a function of moving the lens and/or the image sensor so as to cancel vibration (movement) generated in the image sensor by external force. Meanwhile, "Camera shake correction function" may correspond to "Optical Image Stabilization (OIS).

Figure 2:
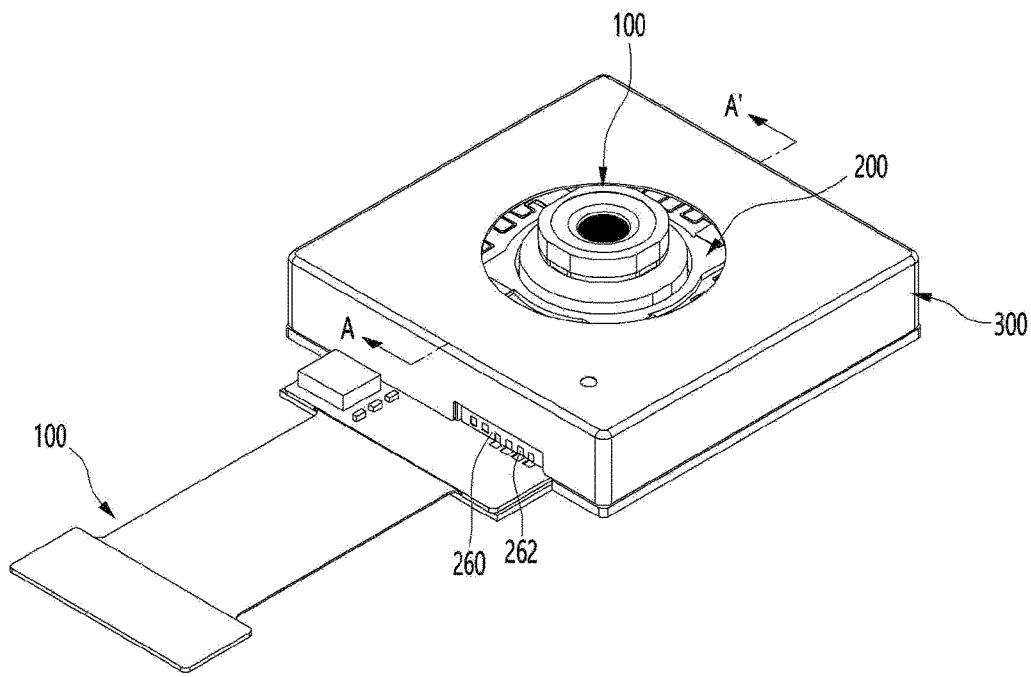
FIG. 2 is a perspective view of a camera device according to a present embodiment.
Figure 3:
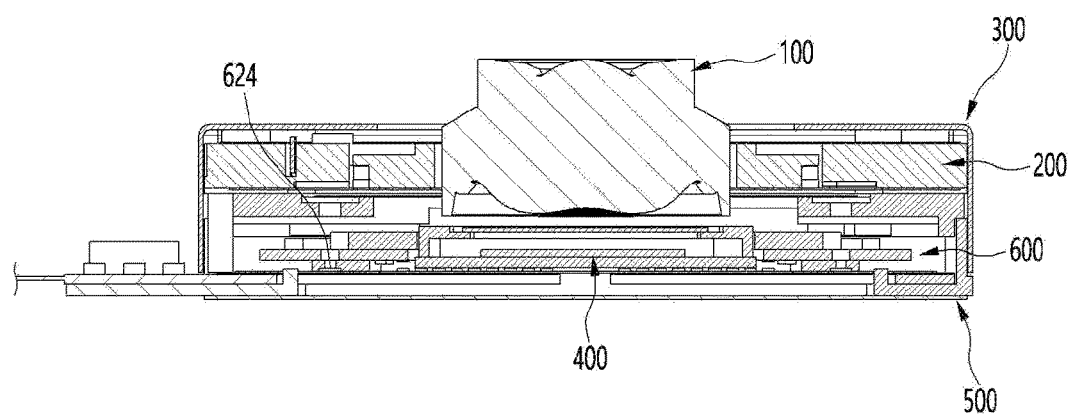
FIG. 3 is a cross-sectional view taken along line A-A' of FIG. 2.
Figure 4:
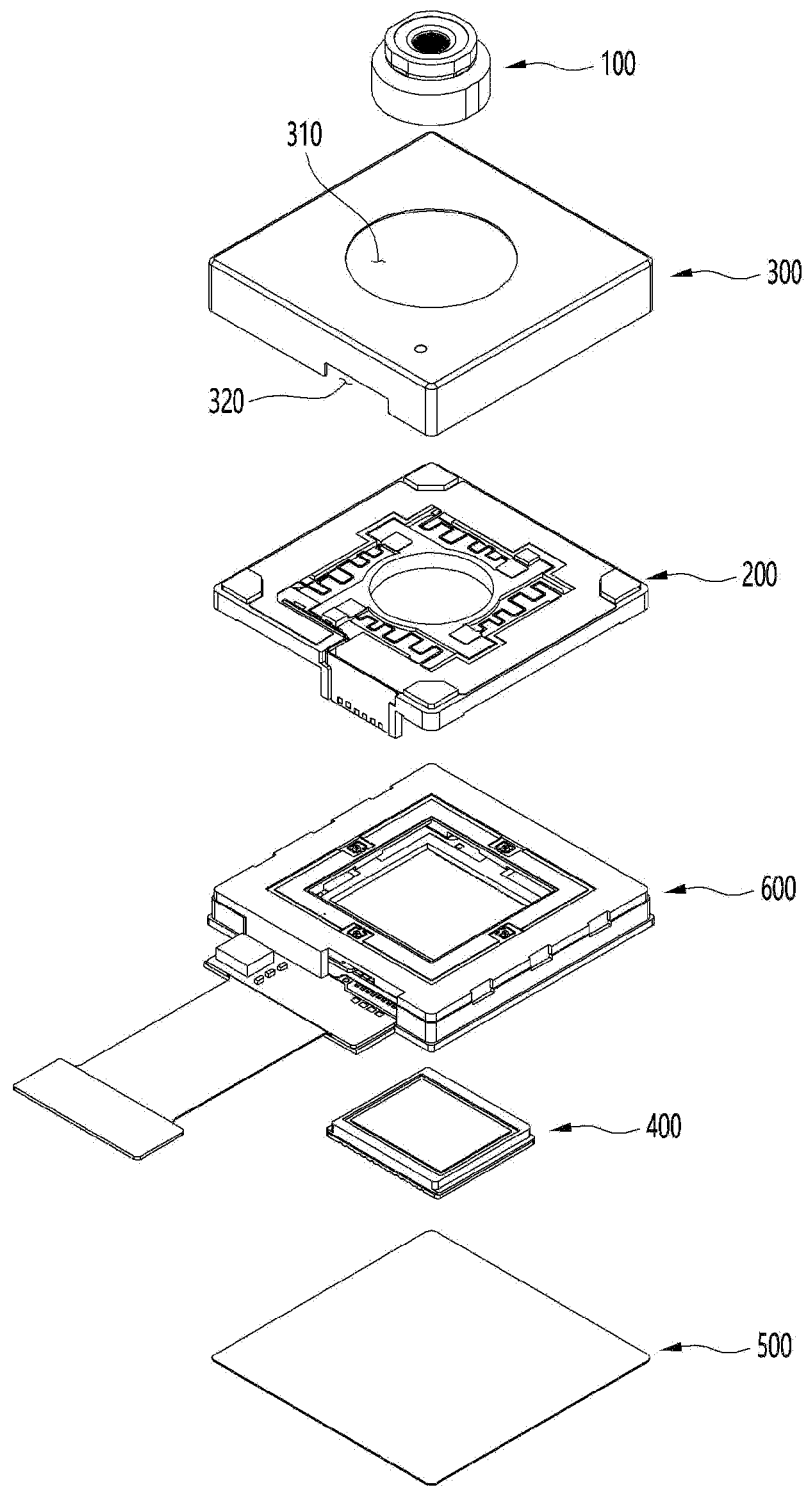
FIG. 4 is an exploded perspective view of the camera device according to the present embodiment.

FIG. 2 is a perspective view of a camera device according to a present embodiment, FIG. 3 is a cross-sectional view taken along line A-A' of FIG. 2, and FIG. 4 is an exploded perspective view of the camera device according to the present embodiment.

The camera device in the embodiment may include a camera module. The camera device may include a lens driving device. Here, the lens driving device may be a voice coil motor (VCM). The lens driving device may be a lens driving motor. The lens driving device may be a lens driving actuator. The lens driving device may be a first actuator. The camera device may include a sensor driving device. Here, the sensor driving device may be a voice coil motor. The sensor driving device may be a sensor driving motor. The sensor driving device may be a sensor driving actuator. The sensor driving device may be a second actuator.

Here, the lens driving device may include an AF module.

In addition, the sensor driving device may include an OIS module.

<Camera Device>

A camera device may include a lens module 100.

The lens module 100 may include a lens and a lens barrel. The lens module 100 may include a lens and a lens barrel. The lens module 100 may include one or more lenses and a lens barrel capable of accommodating one or more lenses. However, one configuration of the lens module 100 is not limited to the lens barrel, and any holder structure capable of supporting one or more lenses may be used. The lens module 100 is coupled to the first actuator 200 to move. The lens module 100 may be coupled to an inner side of the first actuator 200 as an example. Accordingly, the lens module 100 may move the inner side the first actuator 200 in response to the movement of the first actuator 200. The lens module 100 may be screw-coupled to the first actuator 200. As an example, the lens module 100 may be coupled to the first actuator 200 by an adhesive (not shown). Meanwhile, a light passing through the lens module 100 may be irradiated to an image sensor. Meanwhile, the lens module 100 may include, for example, five lenses. The lens module 100 may include a liquid lens and a solid lens. The liquid lens includes a conductive liquid and a non-conductive liquid, and the interface between the conductive liquid and the non-conductive liquid can be controlled by electrical force. The liquid lens may be a lens whose focal length is adjusted by adjusting the interface.

The camera device may include an actuator.

In detail, the camera device may include a first actuator 200 for shifting the lens module 100. The first actuator 200 may be an AF module. The first actuator 200 may move the lens module 100 in a vertical direction (obviously, an optical axis direction). That is, the first actuator 200 may perform an auto focus function by moving the lens module 100 in the optical axis direction.

A second actuator 600 may drive an image sensor 430. The second actuator 600 may tilt or rotate the image sensor 430. The second actuator 600 may move the image sensor 430. The second actuator 600 may move the image sensor 430 in a first direction perpendicular to an optical axis, move the image sensor 430 in a second direction perpendicular to the optical axis and the first direction, and rotate the image sensor 430 based on the optical axis. In this case, the first direction may be an x-axis direction, the second direction may be a y-axis direction, and the optical axis may be a z-axis direction.

Meanwhile, the first actuator 200 and the second actuator 600 may include a driver to move the lens module 100 and the image sensor 430, respectively. That is, the first actuator 200 may include a first driver (described later). In addition, the second actuator 600 may include a second driver (described later). Each of the first and second drivers may include a coil and a magnet. In addition, the coil and the magnet may generate an electromagnetic force therebetween to drive the lens module 100 and the image sensor 430, respectively.

The camera device may include case.

The case may include at least one of a first case 300 and a second case 500. The first case 300 may be an upper case that covers an upper region of the camera device. In this case, the first case 300 may be a shield can.

The first case 300 may be disposed to surround side portions of the first actuator 200, the second actuator 600, and the image sensor module 400 constituting the camera device. The first case 300 may include a first open region 310 formed on an upper surface. The first open region 310 of the first case 300 may be a hollow hole. The lens module 100 coupled to the first actuator 200 may be disposed to correspond to the first open region 310 of the first case 300. In this case, the first open region 310 of the first case 300 may have a larger diameter than that of the lens module 100.

Specifically, the first case 300 may include an upper plate and a plurality of side plates that are curved or bent at an edge of the upper plate and extend downward. For example, the upper plate of the first case 300 may have a rectangular shape, and thus may include four side plates extending downward from four edges of the upper plate. For example, the first case 300 may have a rectangular parallelepiped shape in which the first open region 310 into which the lens module 100 is inserted is formed on the upper surface, a lower surface is opened, and corners are rounded.

Meanwhile, a second open region 320 may be formed on any one of the four side plates of the first case 300. The second open region 320 may be an exposure hole for exposing a part of the first actuator 200 disposed in the first case 300 to an outside. For example, the second open region 320 of the first case 300 may expose a terminal 262 of a flexible circuit board 260 of the first actuator 200. The second open region 320 may be an opening for soldering performed for coupling the terminal of the flexible circuit board 260 and a first substrate of a second actuator to be described later.

The second case 500 may be a lower case that covers a lower region of the camera device. The second case 500 may cover part or all of an open lower region of the first case 300.

Each of the first actuator 200, the second actuator 600, and the image sensor module 40 constituting the camera device may be disposed in an accommodating space formed by the first case 300 and the second case 500.

The image sensor module 400 may be coupled to the second actuator 600. Preferably, the second actuator 600 may be composed of a fixed portion (to be described later) and a moving portion (to be described later). In addition, the moving portion of the second actuator 600 may include second and third substrates, which will be described later. Also, the second actuator 600 may include a movement guide portion disposed between the fixed portion and the moving portion. A part of the movement guide portion. is connected to the fixed portion and the other part is connected to the moving portion, and thus the movement of the moving portion may be guided. Accordingly, the movement guide portion may be referred to as an elastic portion including an elastic material.

In this case, the fourth substrate may include a moving region and a fixed region. In addition, the movement guide portion or the elastic portion of the second actuator may include the moving region of the fourth substrate and components disposed on the moving region. Preferably, the moving portion of the second actuator may include a moving region of the fourth substrate and a second substrate and a third substrate disposed on the moving region. This will be described in detail below. Meanwhile, a moving region of the fourth substrate may be an inner frame of the fourth substrate to be described later, and a fixed region of the fourth substrate may be an outer frame of the fourth substrate to be described later.

The moving portion of the second actuator 600 may move with respect to the fixed portion by an electromagnetic force of a second driving portion. Here, the moving may include at least one of movement in the first direction, movement in the second direction, movement in the optical axis direction, and rotation movement in the second direction. In addition, the second actuator 600 may include a connection wire (described later) coupled between the fixed portion and the moving portion. Preferably, the second actuator 600 in the first embodiment has a structure in which the connection wire is omitted, and accordingly, there is no configuration of a supporting role for preventing a tilt phenomenon occurring in the moving portion between the fixed portion and the moving portion. And, the second actuator 600 in the second embodiment includes a connection wire, and the connection wire may serve as a support for supporting the moving portion in order to prevent a tilt phenomenon occurring in the moving portion when the second actuator is driven, not as an electrical signal transmission role.

In addition, the image sensor module 400 may be coupled to the moving portion of the second actuator 600. The image sensor module 400 may include an image sensor 440. The image sensor 440 may be any one of a charge coupled device (CCD), a metal oxide semi-conductor (MOS), a CPD, and a CID.

In this embodiment, the image sensor 440 may be rotated about the x-axis, the y-axis, and the z-axis. The image sensor 440 may move along the x-axis, y-axis, and z-axis. The image sensor 440 may be tilted about an x-axis, a y-axis, and a z-axis.

That is, the image sensor module 400 is coupled to the moving portion of the second actuator 600, and it may move relative to the fixed portion of the second actuator 600 together with the moving portion of the second actuator 600 when the moving portion of the second actuator 600 moves relative to the fixed portion of the second actuator 600. As a result, the hand-shake correction function may be performed.

As described above, in the embodiment, the AF function may be performed by the first actuator 200 or a liquid lens of the lens module, and the hand shake correction function may be performed by the second actuator 600. Alternatively, the second actuator 600 may perform both the AF function and the handshake correction function.

The camera device according to the present embodiment performs a handshake correction function and/or an autofocus function by moving the image sensor module 400 relative to the lens module 100.

Meanwhile, recently, as the camera technology has been developed, an image resolution has been increased, thereby increasing a size of the image sensor 440. At this time, as the size of the image sensor 440 increases, a size of the lens module 100 and parts of the actuator for shifting the lens module 100 are also increase. Accordingly, as a weight of the other actuator components for shifting the lens module 100 as well as the weight of the lens module 100 increases, it is difficult to stably shift the lens module 100 using the conventional VCM technology, and a lot of problems occur in terms of reliability.

Accordingly, in the present embodiment, AF is performed using the first actuator 200 implementing a lens shift method, and OIS is executed using the second actuator 600 implementing the image sensor shift method, thereby, the reliability of the camera device is improved.

Furthermore, there is a 5-axis camera shake in the camera shake of the camera device. For example, in the 5-axis camera shake, there are two camera shakes that are shaken at an angle, two camera shake that is shaken by a shift, and one camera shake that are shaken by rotation. At this time, only the 4-axis camera shake correction is possible with the lens shift method, and the camera shake that are shaken in rotation cannot be corrected. This is because the camera shake caused by rotation should be corrected by rotation of the optical module, and even when the lens module 100 is rotated, an incident optical path is maintained as it is, and accordingly, the 5-axis camera shake correction is not possible with the lens shift method. Therefore, in the present embodiment, it is possible to solve a reliability problem of the lens shift method according to the development of the camera technology as described above, while applying the sensor shift method so as to enable the 5-axis camera shake correction.

Hereinafter, each configuration of the camera device according to the embodiment will be described in more detail.

<First Actuator>

Figure 5:
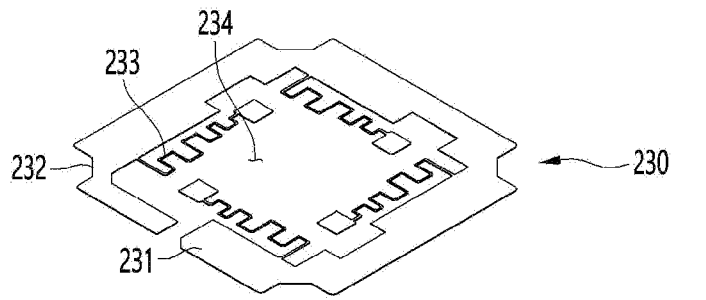
FIG. 5 is an exploded perspective view of a first actuator shown in FIG. 4.
Figure 6:
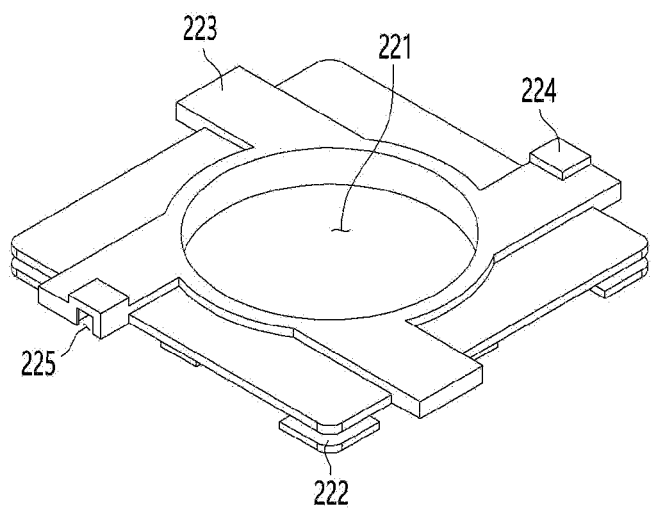
FIG. 6 is a perspective view of a bobbin shown in FIG. 5.
Figure 7:
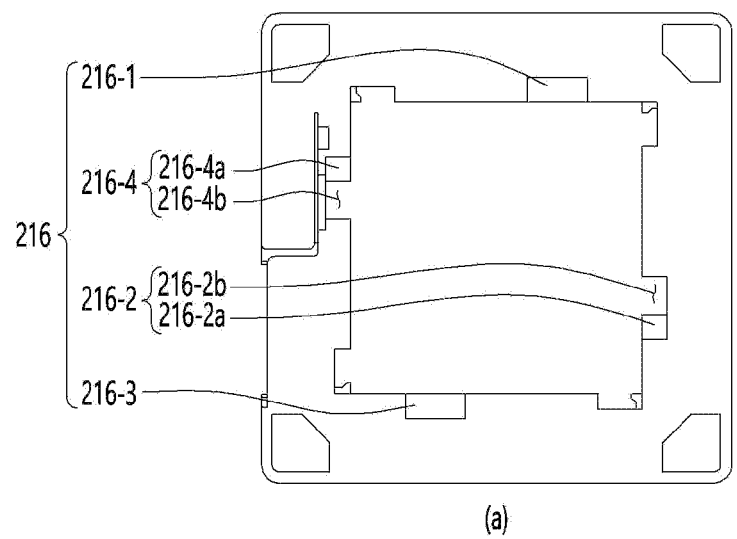
FIG. 7 (a) is a plan view of a base of FIG. 5.
Figure 7:
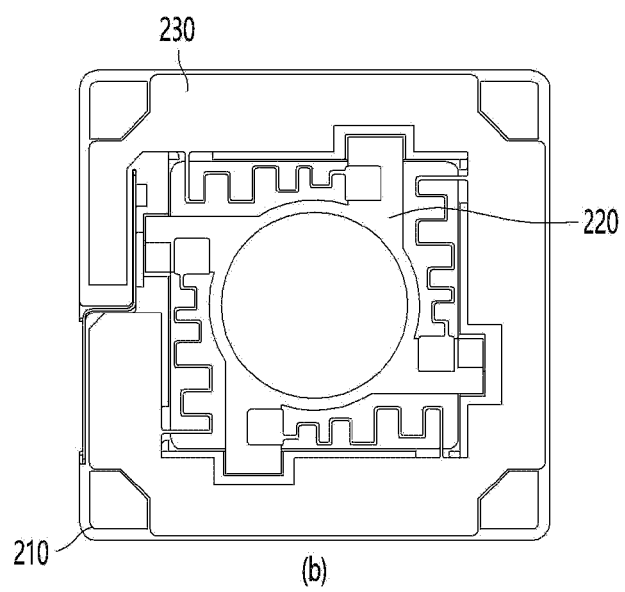
Figure 8:
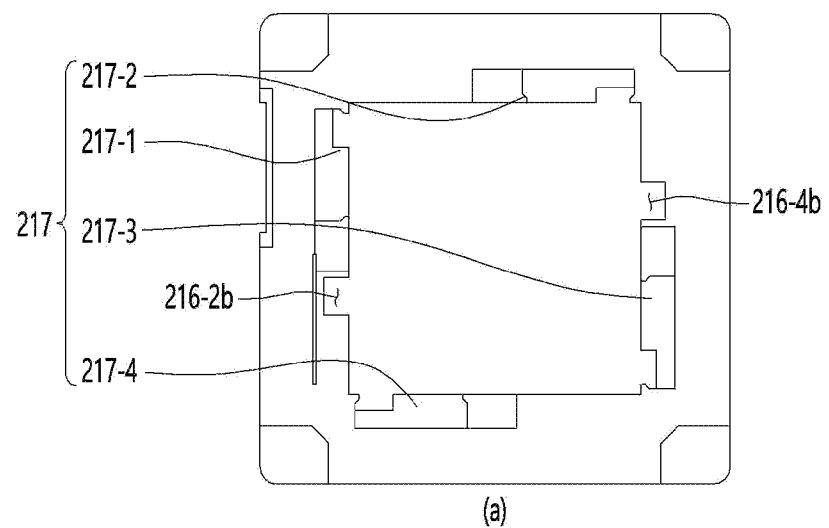
FIG. 8 (a) is a bottom view of the base of FIG. 5.
Figure 8:
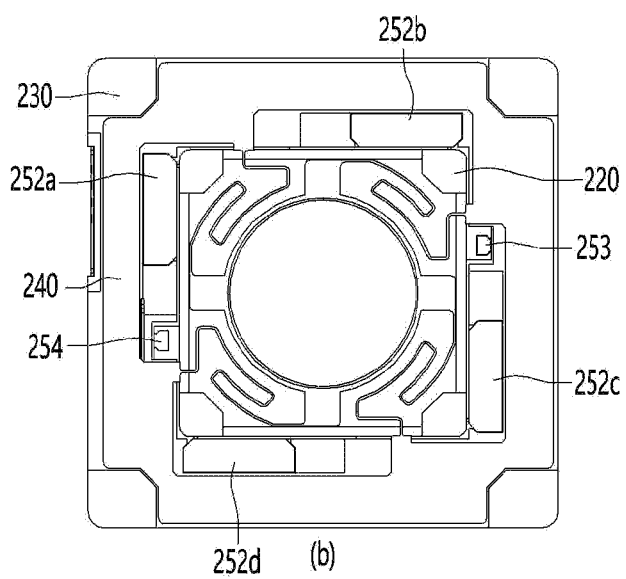

FIG. 5 is an exploded perspective view of a first actuator shown in FIG. 4, FIG. 6 is a perspective view of a bobbin shown in FIG. 5, FIG. 7 (*a*) is a plan view of a base of FIG. 5, FIG. 7 (*b*) is a plan view of the first actuator of FIG. 5, FIG. 8 (*a*) is a bottom view of the base of FIG. 5, and FIG. 8 (*b*) is a bottom view of the first actuator of FIG. 5.

Referring to FIGS. 5 and 8, a first actuator 200 may include a base 210, a bobbin 220, a first elastic member 230, a second elastic member 240, and a first driver 250.

In the first actuator 200 in an embodiment, the bobbin 220 may be elastically supported in a vertical direction by the base 210 via the first elastic member 230 and the second elastic member 240, and the bobbin 220 may move in the vertical direction by electromagnetic interaction of the first driver 250 disposed at the bobbin 220. Accordingly, the lens module 100 coupled to the bobbin 220 may move in the optical axis direction. In addition, an auto focus (AF) function may be performed as the lens module 100 moves in the optical axis direction.

The base 210 may be a fixing member of the first actuator 200. The base 210 may be disposed at an inner side of a first case 300 to be coupled to the first case 300.

The base 210 may include a body 211 having a first opening 213 formed at a center thereof. A shape of the body 211 may have a shape corresponding to the first case 300. For example, the shape of the body 211 of the base 210 may have a rectangular parallelepiped shape or a square cross-sectional shape corresponding to a shape of the first case 300.

A plurality of first protrusions 212 are formed on an upper surface of the body 211 of the base 210. The plurality of first protrusions 212 may formed protruding in an upward direction on the upper surface of the body 211. In addition, correspondingly, a plurality of lower protrusions (not shown) may be formed protruding in a downward direction on a lower surface of the body 211. The plurality of first protrusions 212 may be guide protrusions for guiding the coupling the first elastic member 230 disposed on the base 210. The plurality of first protrusions 212 may be disposed at four corner regions on the upper surface of the body 211 of the base 210.

A first opening 213 is formed in the body 211 of the base 210. The first opening 213 may have a shape corresponding to a shape of the bobbin 220. For example, the bobbin 220 may have a quadrangular plate shape, and accordingly, the first opening 213 may also have a quadrangular shape. However, the present embodiment is not limited thereto, and the bobbin 220 may have a cylindrical shape, and accordingly, the first opening 213 may also have a circular shape. A size of the first opening 213 may be larger than that of the bobbin 220. For example, in a state in which the bobbin 220 is inserted into the first opening 213, a predetermined gap may exist between an inner surface of the body 211 of the base 210 and an outer surface of the bobbin 220.

A stepped protrusion 216 may be formed on the inner surface of the body 211 of the base 210. The stepped protrusion 216 may limit movement of the bobbin 220 while selectively supporting the bobbin 220 disposed in the first opening 213. For example, the stepped protrusion 215 may function as a stopper for limiting movement of the bobbin 220 in a downward direction. That is, when the bobbin 220 in a normal state may not be in contact with the stepped protrusion 215 in a state in which the bobbin 220 is disposed in the first opening 213, and the bobbin 220 may be in contact with the stepped protrusion 215 when the bobbin 220 moves to a movement limit range in a downward direction.

The stepped protrusion 215 may include first to fourth stepped protrusions 216-1, 216-2, 216-3, and 216-4. The first to fourth stepped protrusions 216-1, 216-2, 216-3, and 216-4 may be disposed on an inner surface of the base 210 to be spaced apart from each other by a predetermined distance. Preferably, the base 210 may include four inner surfaces, and accordingly, the first to fourth stepped protrusions 216-1, 216-2, 216-3, and 216-4 may be respectively disposed on four inner surfaces.

In this case, each of the first to fourth stepped protrusions 216-1, 216-2, 216-3 and 216-4 includes a support region in contact with the bobbin 220.

Here, at least two of the first to fourth stepped protrusions 216-1, 216-2, 216-3, and 216-4 may include only the support region. In addition, the remaining two stepped protrusions of the first to fourth stepped protrusions 216-1, 216-2, 216-3, and 216-4 may include a support region and an open region.

For example, the second stepped protrusion 216-2 may include a first support region 216-2a and a first open region 216-2b. And, the fourth stepped protrusion 216-4 disposed on the inner surface facing the second stepped protrusion 216-2 may include a second support region 216-4a and a second open region 216-4b.

Also, the first stepped protrusion 216-1 and the third stepped protrusion 216-3 may include only a support region.

Here, the first open region 216-2b and the second open region 216-4b may be exposure holes for exposing a portion of the first driver 250 disposed on the bobbin 220. Preferably, the first open region 216-2b and the second open region 216-4b may be a sensor magnet exposure region for exposing sensor magnets 253 and 254 of the first driver 250 disposed on the bobbin 220.

In this case, a sensor magnet mounting portion (not shown) formed on the bobbin 220 may be disposed in the first open region 216-2b and the second open region 216-4b. The first open region 216-2b and the second open region 216-4b may be formed in order to minimize a distance between the sensor magnets 253 and 254 mounted on the sensor magnet mounting portion of the bobbin 220 and a driver IC (not shown) mounted on the flexible circuit board 260.

A first driving magnet mounting groove 216 is formed on the lower surface of the body 211 of the base 210. That is, the first-first driving magnet mounting groove 217-1 is formed in a first region of the lower surface of the body 211 of the base 210. In addition, a first-second driving magnet mounting groove 217-2 is formed in a second region of the lower surface of the body 211 adjacent to the first region. In addition, a first-third driving magnet mounting groove 217-3 is formed in a third region of the lower surface of the body 211 that is adjacent to the second region and faces the first region. In addition, a first-third driving magnet mounting groove 217-4 may be formed in a fourth region of the lower surface of the body 211 that faces the second region and is between the first and third regions.

In this case, the first actuator 200 in the embodiment moves the bobbin 220 in the optical axis direction using four first driving magnets 252a, 252b, 252c, and 252d.

In addition, the first driving magnets 252a, 252b, 252c, and 252d may generate magnetic field interference with the second driving magnet of the second actuator 600. In this case, the first driving magnets 252a, 252b, 252c, and 252d are disposed in a state in which the first driving magnets 252a, 252b, 252c, and 252d are fixed to the body 211 of the base 210. In addition, the second driving magnet of the second actuator 600 is also disposed to be fixed to a fixed portion, not a moving portion. As described above, in the embodiment, the first driving magnets 252a, 252b, 252c, and 252d and the second driving magnet are disposed at fixed positions, respectively. That is, in the embodiment, a coil is disposed at a portion moving depending on a lens shift and an image sensor shift, and accordingly, the driving magnets are continuously positioned in the fixed position, thereby minimizing magnetic field interference that may occur between the first and second driving magnets.

Meanwhile, the body 211 of the base 210 includes a substrate groove 214 into which the flexible circuit board 260 is inserted. In this case, the flexible circuit board 260 may be inserted into the substrate groove 214 vertically in an upright state. In this case, the substrate groove 214 may have a bent shape bent at least once. That is, the flexible circuit board 260 is inserted into the substrate groove 214, and in this case, a driver IC is disposed in the flexible circuit board 260. The driver IC may be a hall sensor built-in driver. Accordingly, the driver IC may sense a position of the lens module 100 by sensing a change in electric field magnitude that changes depending on positions of the sensor magnets 253 and 254, and accordingly, control an output signal.

In this case, the driver IC is disposed to face the sensor magnets 253 and 254. In this case, as a distance between the sensor magnets 253 and 254 and the driver IC is closer, accuracy of position sensing information of the bobbin 220 or the lens module 100 obtained via the driver IC may be improved. In addition, a terminal 262, which is electrically connected to a first substrate (described later) of the second actuator 600, is disposed in the flexible circuit board 260. In this case, in order to electrically connect between the terminal 262 and the first substrate, a process such as soldering should be performed. Accordingly, the terminal 262 should be positioned close to an outer surface of the base 210.

That is, the flexible circuit board 260 includes a first substrate region 261 in which the terminal 262 is disposed and a second substrate region 262 in which the driver IC is disposed. In addition, the flexible circuit board 260 has the first substrate region 261 positioned adjacent to the outer surface of the base 210 and the second substrate region 1263 positioned adjacent to an inner surface of the base 210, and to this end, a bending region may be included between the first and second substrate regions.

The bobbin 220 is disposed in the first opening 213 of the base 210.

A second opening 221 may be formed at a center of the bobbin 220. The second opening 221 may have a shape corresponding to the lens module 100. For example, the second opening 221 may have a circular shape corresponding to a shape of the lens module 100, but is not limited thereto. The bobbin 220 may be coupled to the lens module 100. For example, the lens module 100 may be inserted into the second opening 221 of the bobbin 220 and coupled to the bobbin 220.

A plurality of second protrusions 224 in contact with the first elastic member 230 may be formed on an upper surface of the bobbin 220. The plurality of second protrusions 224 may be a stopper that limits a movement range of the bobbin 220 in an upward direction while the bobbin 220 is elastically supported by the first elastic member 230. For example, when the bobbin 220 is out of the movement range in an upward direction, the second protrusion 224 is in contact with an inner surface of an upper surface of the first case 300 positioned in an upper portion of the bobbin 220 to limit the movement of the bobbin 220.

A coil winding portion 222 to which a first coil portion 251 is wound may be formed on the outer surface of the bobbin 220. For example, a coil winding portion 222 having a recessed shape recessed in an inward direction may be formed on the outer surface of the bobbin 220. In addition, the first coil portion 251 may be wound around the coil winding portion 222. The first coil portion 251 may be in the form of a "coil block". The first coil portion 251 may be an "electromagnet". The first coil portion 251 may be disposed to face the first driving magnets 252a, 252b, 252c and 252d, and accordingly, an electromagnetic force may be generated by electromagnetic interaction with the first driving magnets 252a, 252b, 252c and 252d. In this case, the first coil portion 251 may be electrically connected to the second elastic member 240. Accordingly, the first coil portion 251 may receive a current from the second elastic member 240 to generate an electromagnetic force. As a result, the bobbin 220 may move in an optical axis direction to perform an AF function.

A guide protrusion 223 may be selectively supported on the first to fourth stepped protrusions 216-1, 216-2, 216-3, and 216-4 of the base 210, and may be formed on the outer surface of the bobbin 220. The guide protrusion 223 may protrude outward from the outer surface of the bobbin 220.

In addition, the guide protrusion 223 may be formed in plurality. Preferably, the guide protrusion 223 may be composed of four corresponding to the first to fourth stepped protrusions 216-1, 216-2, 216-3, and 216-4.

In addition, a sensor magnet mounting portion 225 may be formed to be recessed toward the inner surface of the base 210 from the guide protrusions facing each other among the plurality of guide protrusions 223 to arrange the sensor magnets 253 and 254. In addition, the sensor magnets 253 and 254 may be mounted on the sensor magnet mounting portion 225 and positioned in the first open region 216-2b and the second open region 216-4 of the base 210. The sensor magnets 253 and 254 move together with the bobbin 220 as the bobbin 220 moves. In addition, magnitude of the magnetic field sensed by the driver IC disposed on the flexible circuit board 260 may be changed depending on positions of the sensor magnets 253 and 254, and the driver IC may sense positions of the sensor magnets 253 and 254, further that of the bobbin 220, and further that of the lens module 100 based on a change in the magnitude of the changing magnetic field.

The first elastic member 230 is disposed above the base 210 and the bobbin 220. The second elastic member 240 is disposed below the base 210 and the bobbin 220. Accordingly, the bobbin 220 may be elastically supported in a vertical direction via the first elastic member 230 and the second elastic member 240 in the first opening of the base 210.

The first elastic member 230 may be a plate spring. The first elastic member 230 may be a metal. Alternatively, the first elastic member 230 may be nonmagnetic. Therefore, the first elastic member 230 may not be affected by a magnetic force of the first driving magnets 252a, 252b, 252c and 252d and an electromagnetic force of the first coil portion 251.

The first elastic member 230 may be disposed on the base 210. In addition, the first elastic member 230 may be disposed above the bobbin 220. The first elastic member 230 may be coupled to the base 210 and the bobbin 220. That is, the first elastic member 230 may include a first-first elastic portion 231 coupled to the base 210 and first-second elastic portion 233 extending from the first-first elastic portion 231 and coupled to the bobbin 220. A guide portion 232 corresponding to the plurality of first protrusions 212 disposed on the upper surface of the body 211 of the base 210 is formed in the first-first elastic portion 231. Accordingly, the first elastic member 230 may elastically support an upper side of the bobbin 220 in a state in which the guide portion 232 is supported to the first protrusion 212. In addition, the first elastic member 230 may include an opening 1234 into which the lens module 100 is inserted at a center thereof.

The second elastic member 240 may be disposed below the base 210. In addition, the second elastic member 240 may be disposed below the bobbin 220. The second elastic member 240 may be coupled to the base 210 and the bobbin 220. That is, the second elastic member 240 may include a second-first elastic portion 1241 coupled to the base 210 and a second-second elastic portion 242 coupled to the bobbin 220. Accordingly, the second elastic member 240 may elastically support a lower side of the bobbin 220 in a state in which the second elastic member 240 is coupled to the base 210. In addition, the second elastic member 240 may include an opening 243 into which the lens module 100 is inserted at a center thereof.

The second elastic member 240 may be electrically connected to the first coil portion 251. The second elastic member 240 may be electrically connected to the flexible circuit board 260. The second elastic member 240 may electrically connect the first coil portion 251 and the flexible circuit board 260. Therefore, in the flexible circuit board 260, a current may be supplied to the first coil portion 251 via the second elastic member 240. In this case, a direction, wavelength, intensity, etc. of the current supplied to the first coil portion 251 may be controlled.

<Second Actuator>

Hereinafter, the second actuator 600 will be described.

The second actuator 600 may be positioned below or above the first actuator 200 and may shift the image sensor module 400.

To this end, the second actuator 600 may include a fixed portion having a fixed position and a moving portion whose position is moved by an electromagnetic force of a second driving portion in a state coupled to the fixed position. The fixed portion means a component whose position is not changed and is fixed among components constituting the second actuator 600 when the second actuator 600 is driven, and the moving portion means a component whose position changes when the second actuator 600 is driven.

Figure 9A:
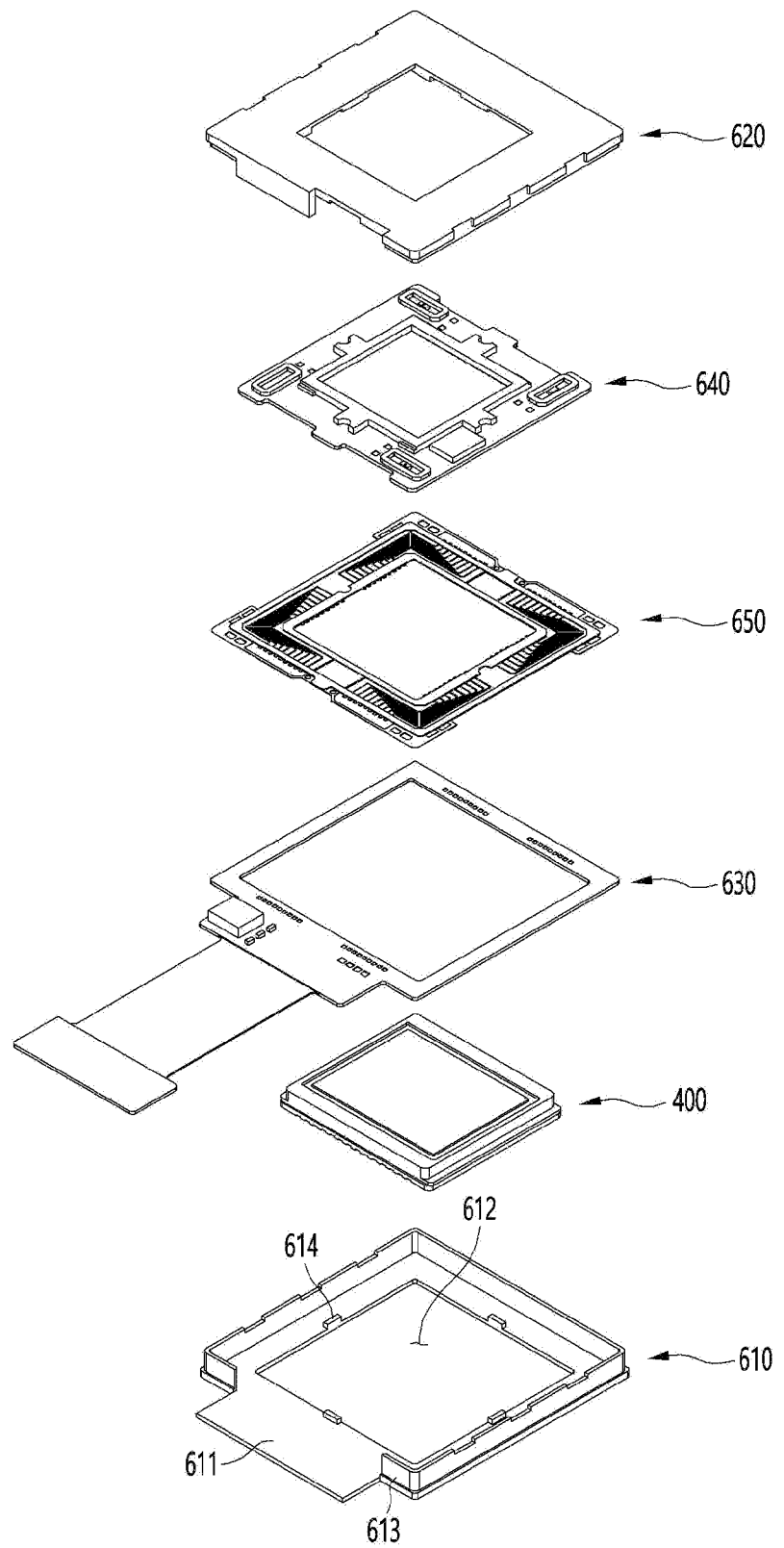
FIG. 9a is an exploded perspective view of a second actuator according to a first embodiment.
Figure 9B:
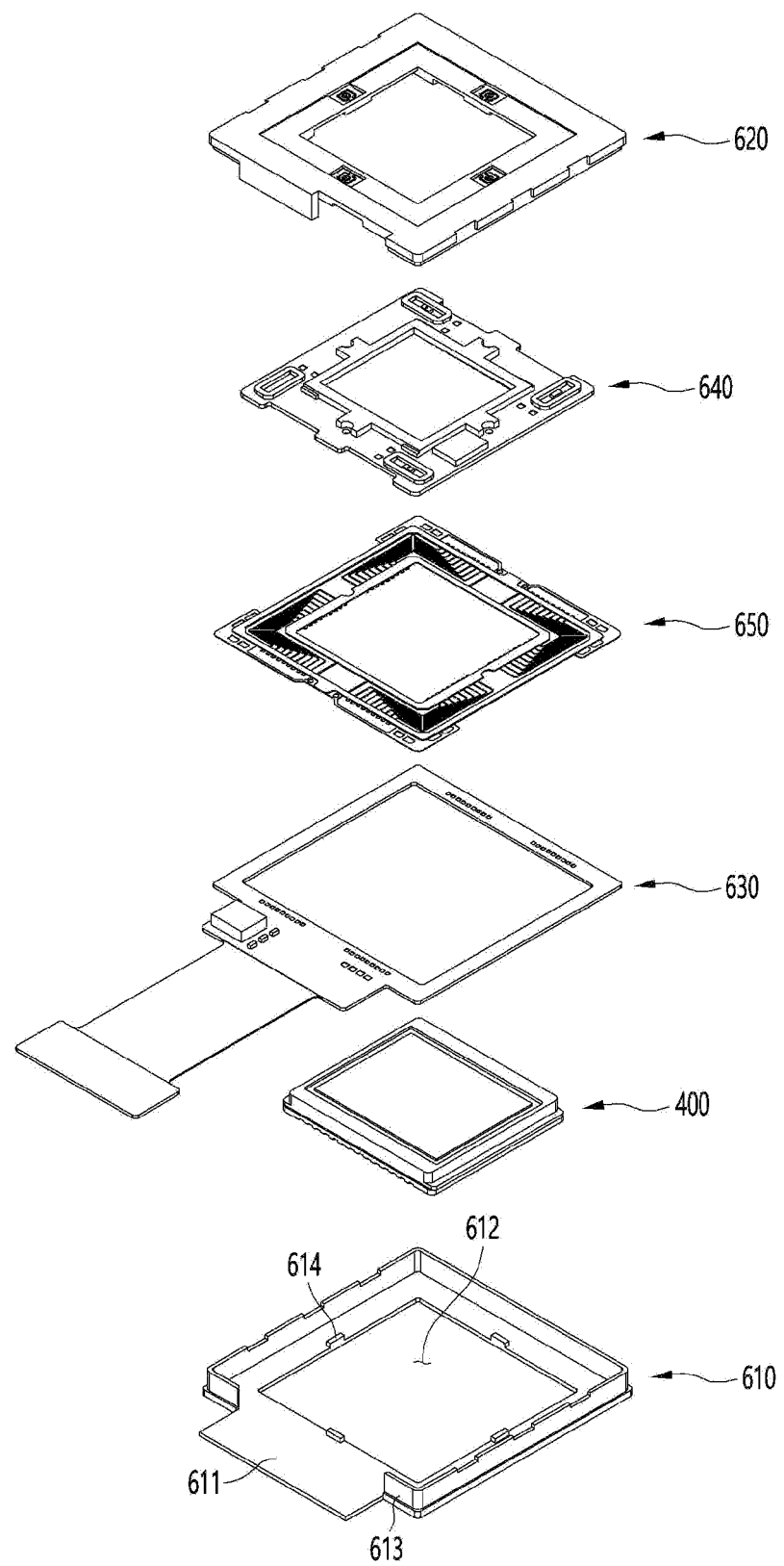
FIG. 9b is an exploded perspective view of a second actuator according to a second embodiment.
Figure 10:
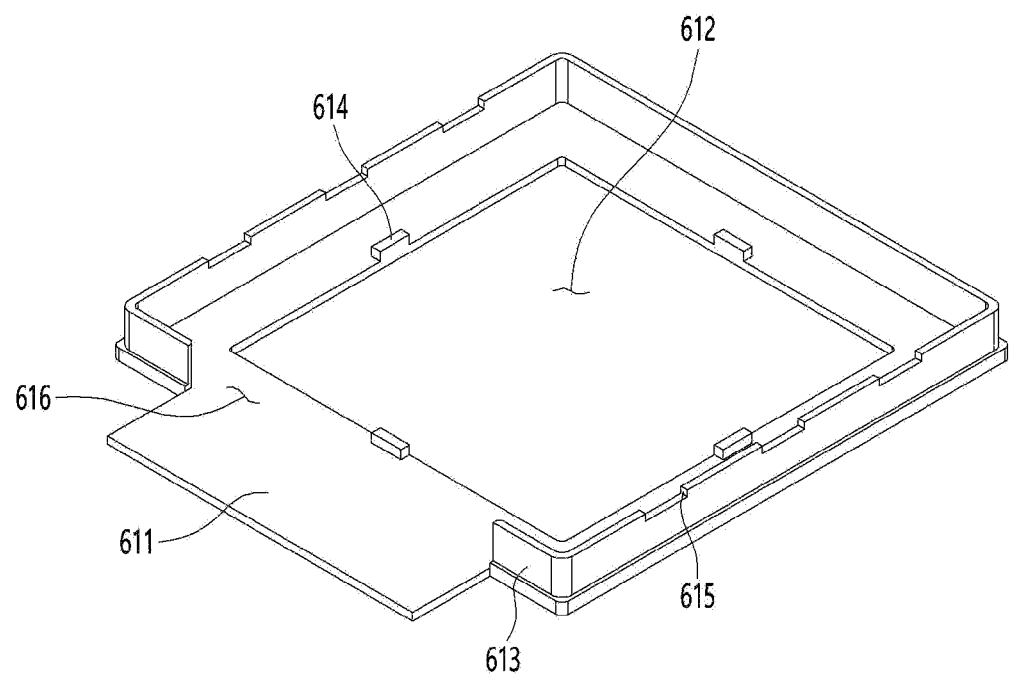
FIG. 10 is a perspective view illustrating a housing shown in FIG. 9.
Figure 11:
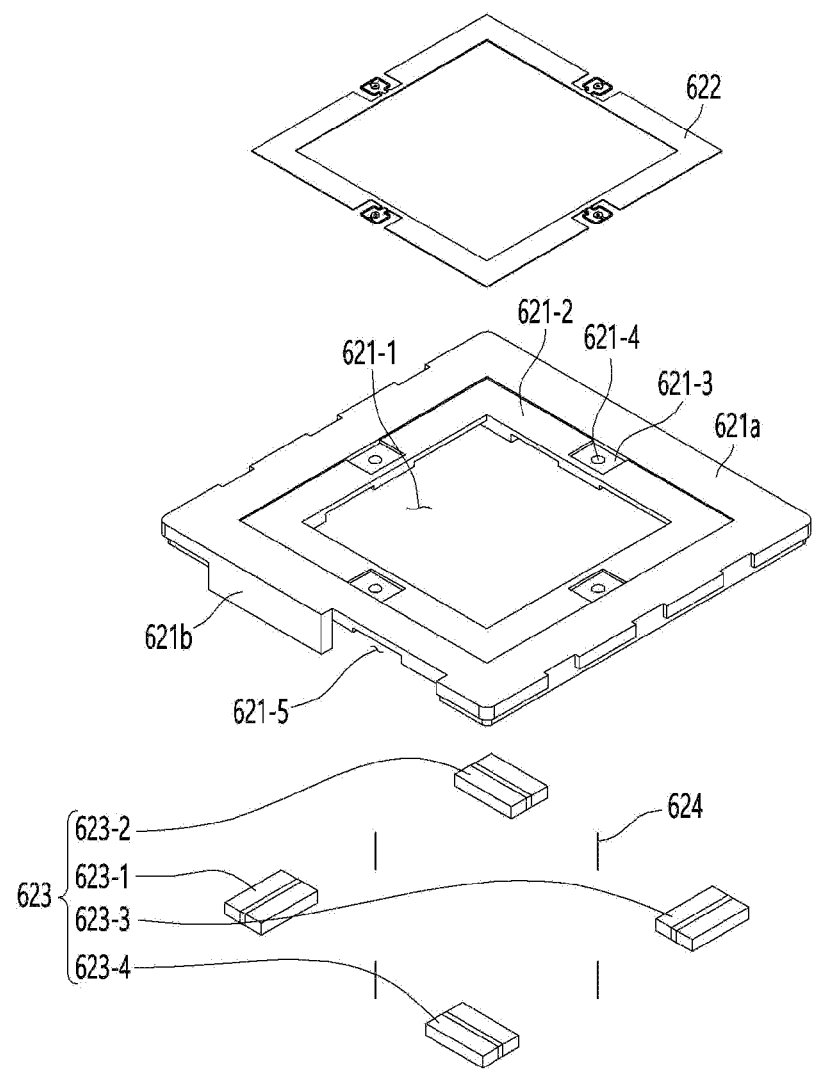
FIG. 11 is an exploded perspective view of a holder shown in FIG. 9.
Figure 12:
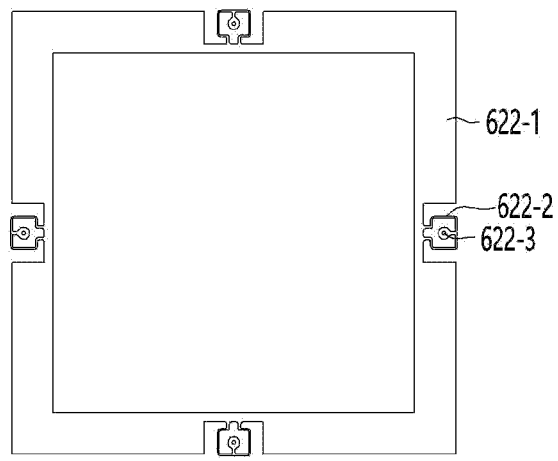
FIG. 12 is a view showing a damping plate shown in FIG. 11.
Figure 13:
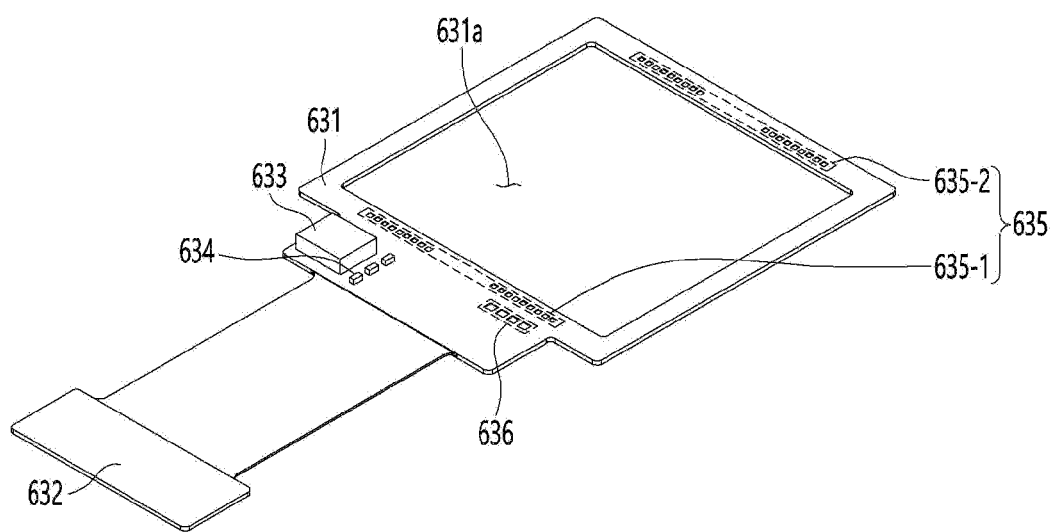
FIG. 13 is a perspective view of a first substrate shown in FIG. 9.
Figure 14:
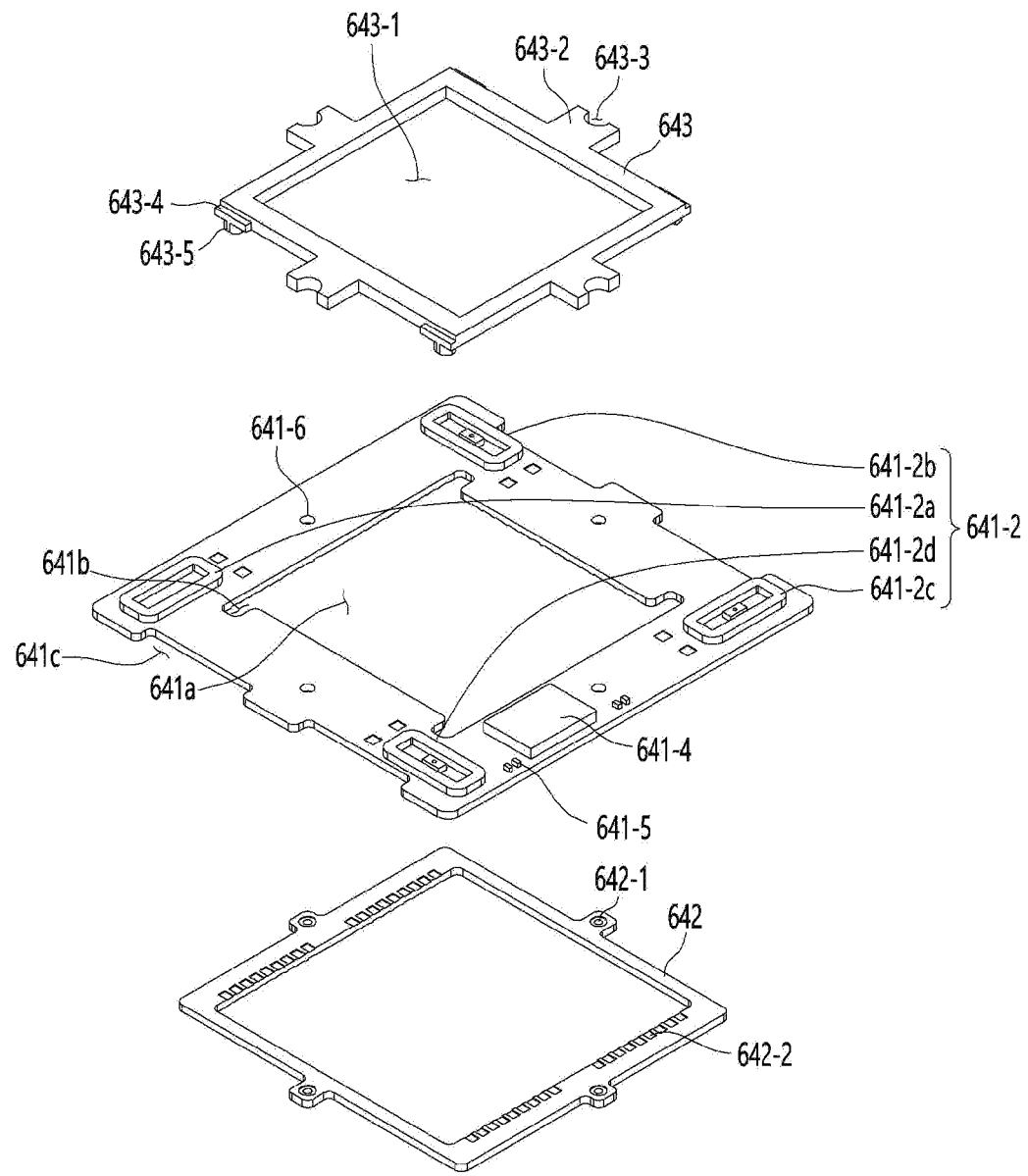
FIG. 14 is an exploded perspective view of a coil moving substrate portion shown in FIG. 9.
Figure 15:
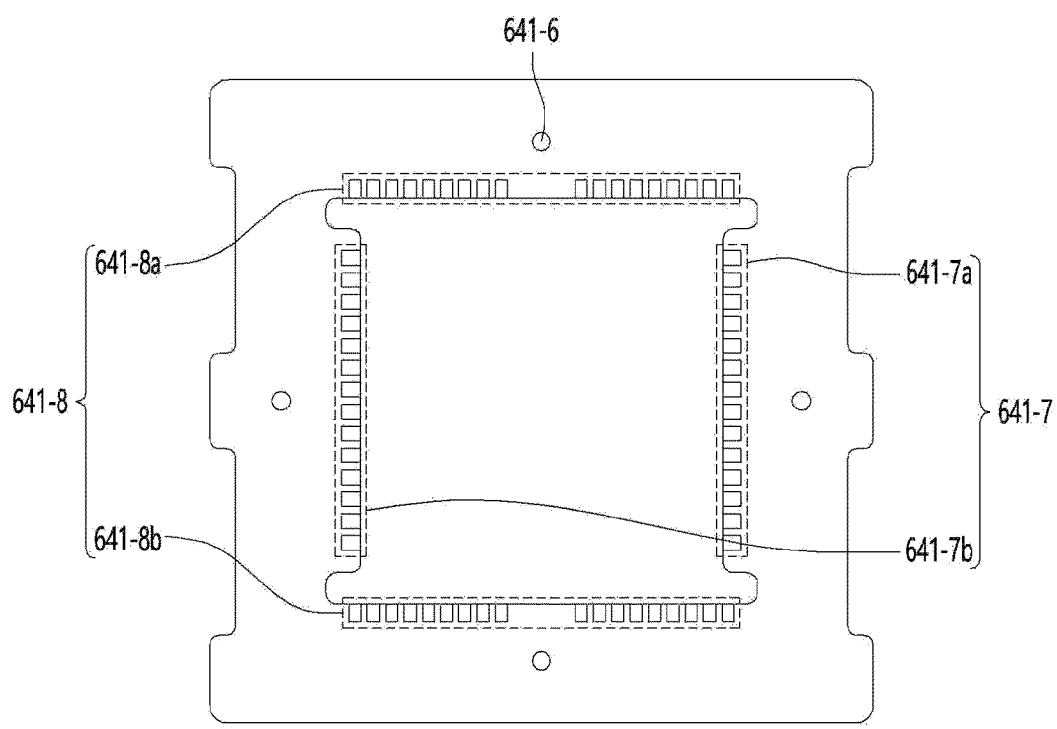
FIG. 15 is a bottom view of a second substrate of the coil moving substrate portion shown in FIG. 14.
Figure 16:
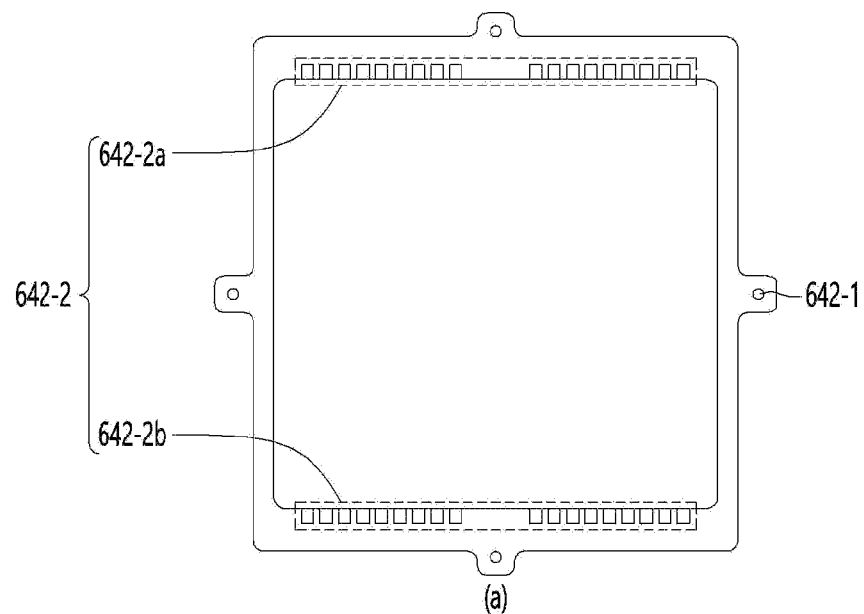
FIG. 16 (a) is a plan view of a third substrate of the coil moving substrate portion shown in FIG. 14.
Figure 16:
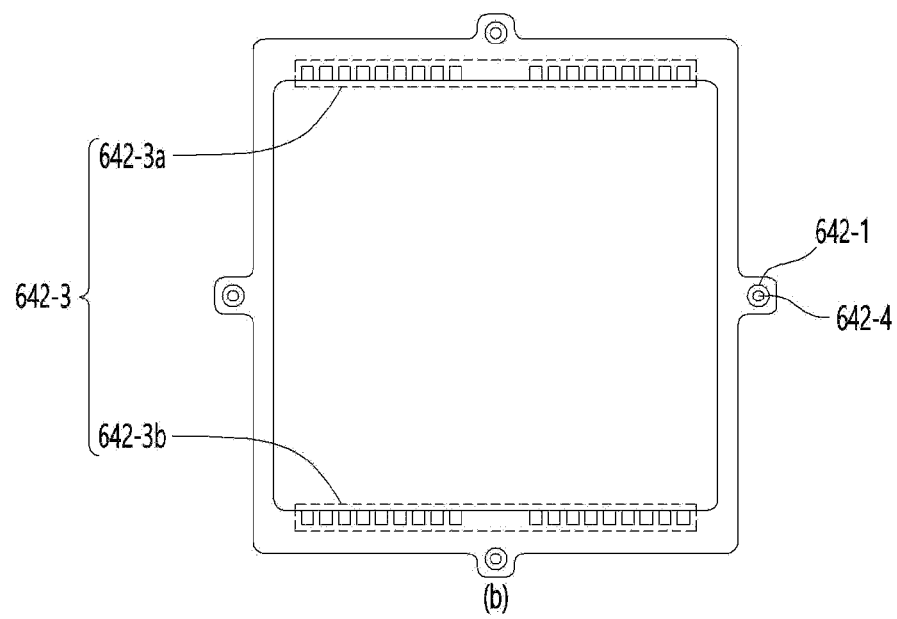
Figure 17:
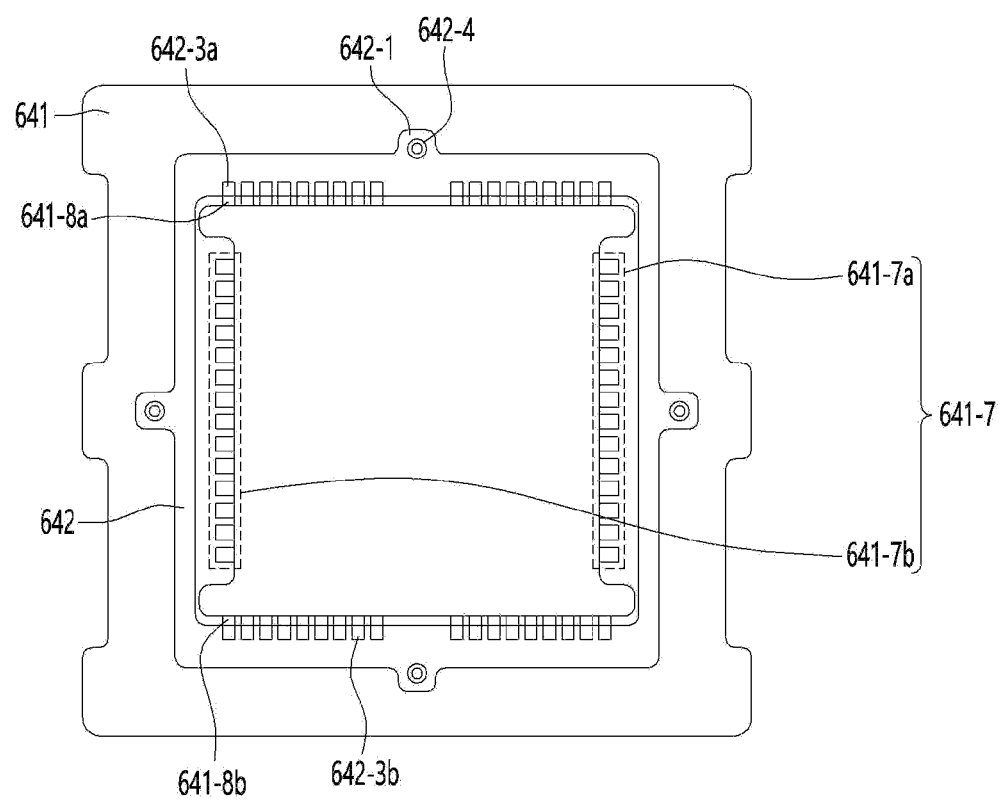
FIG. 17 is a coupling view of a second substrate and a third substrate according to an embodiment.
Figure 18:
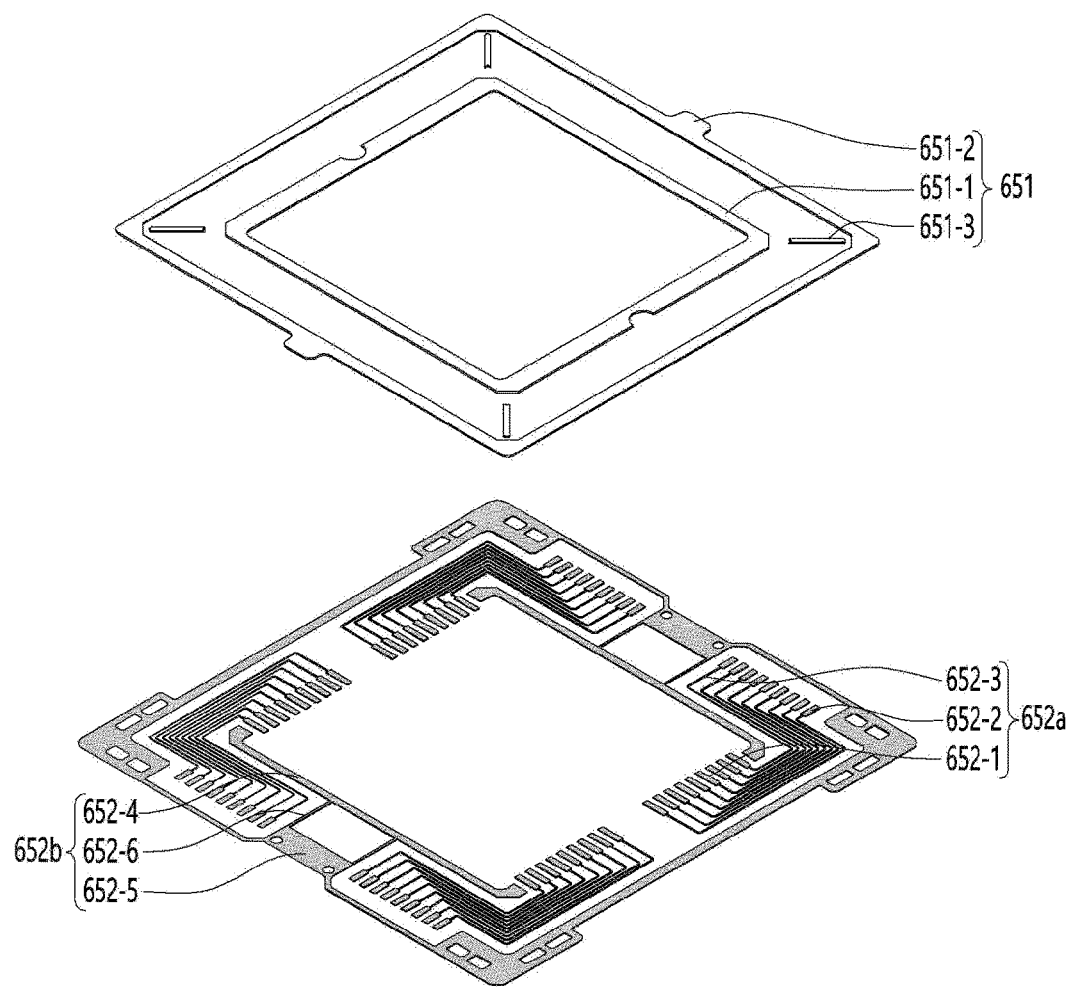
FIG. 18 is an exploded perspective view of a fourth substrate shown in FIG. 9.
Figure 19A:
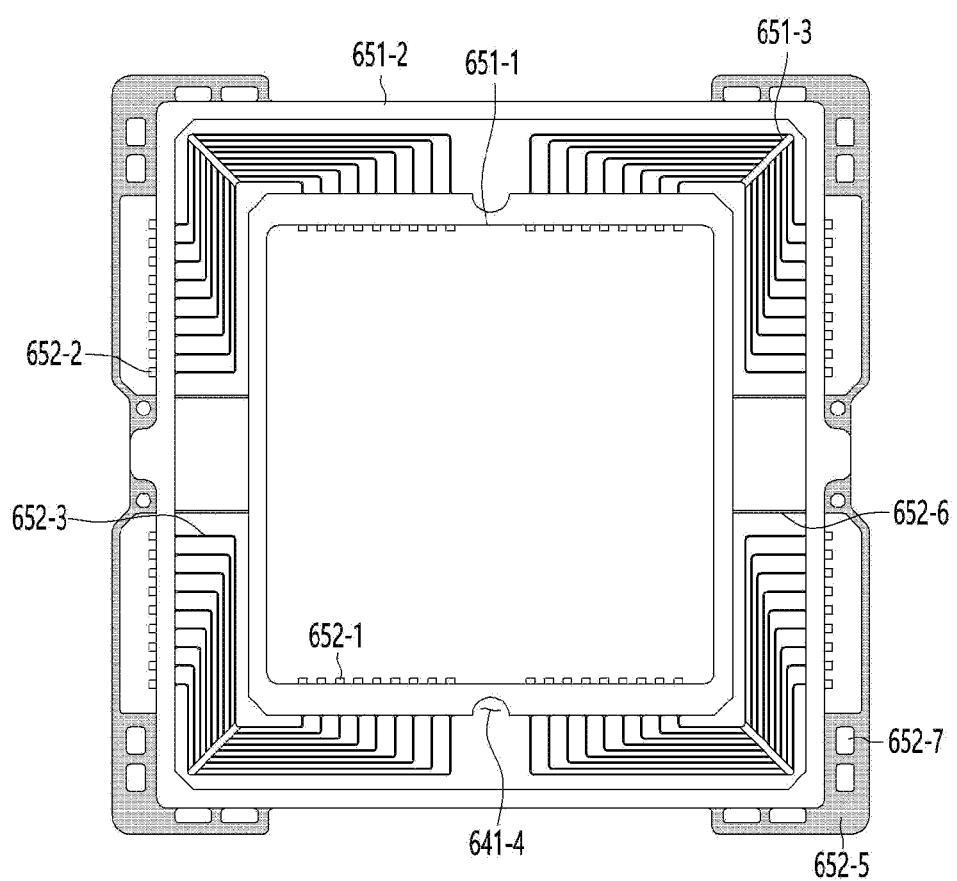
FIG. 19a is a plan view of the fourth substrate shown in FIG. 9.
Figure 19B:
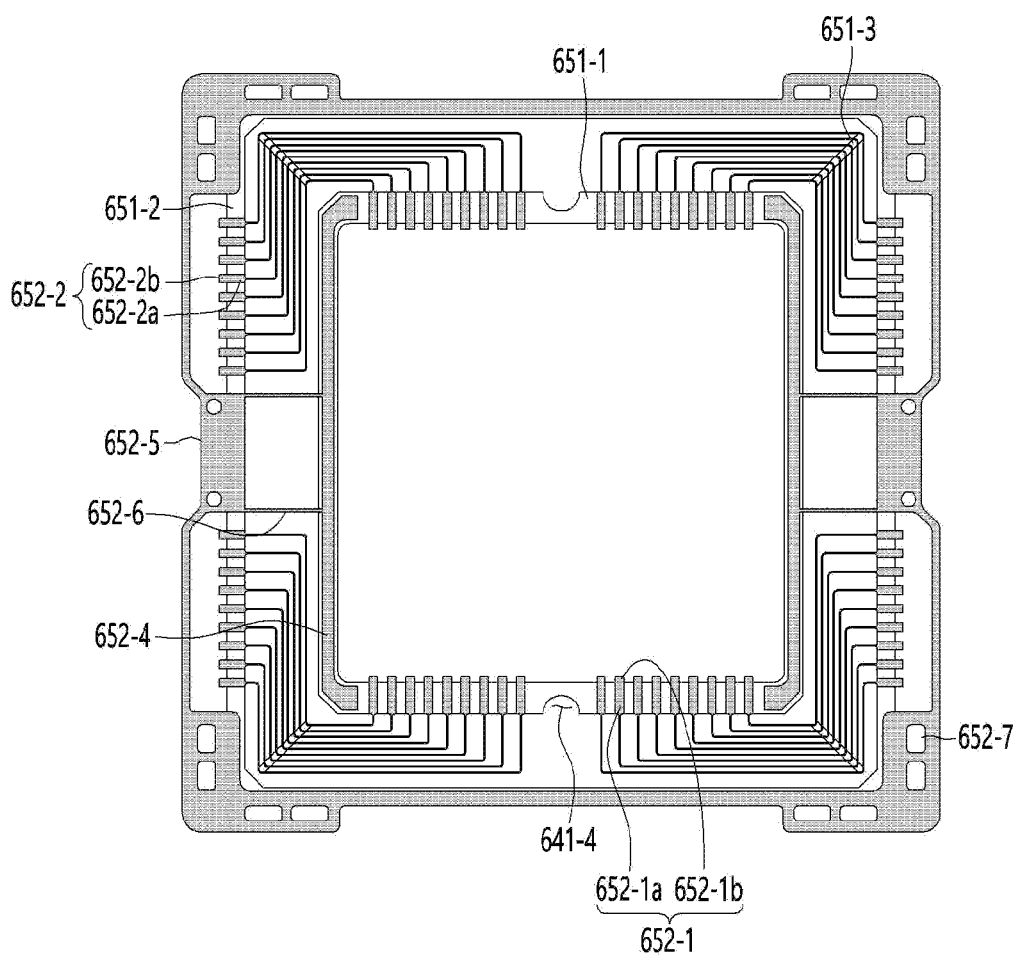
FIG. 19b is a bottom view of the fourth substrate shown in FIG. 9.
Figure 19C:
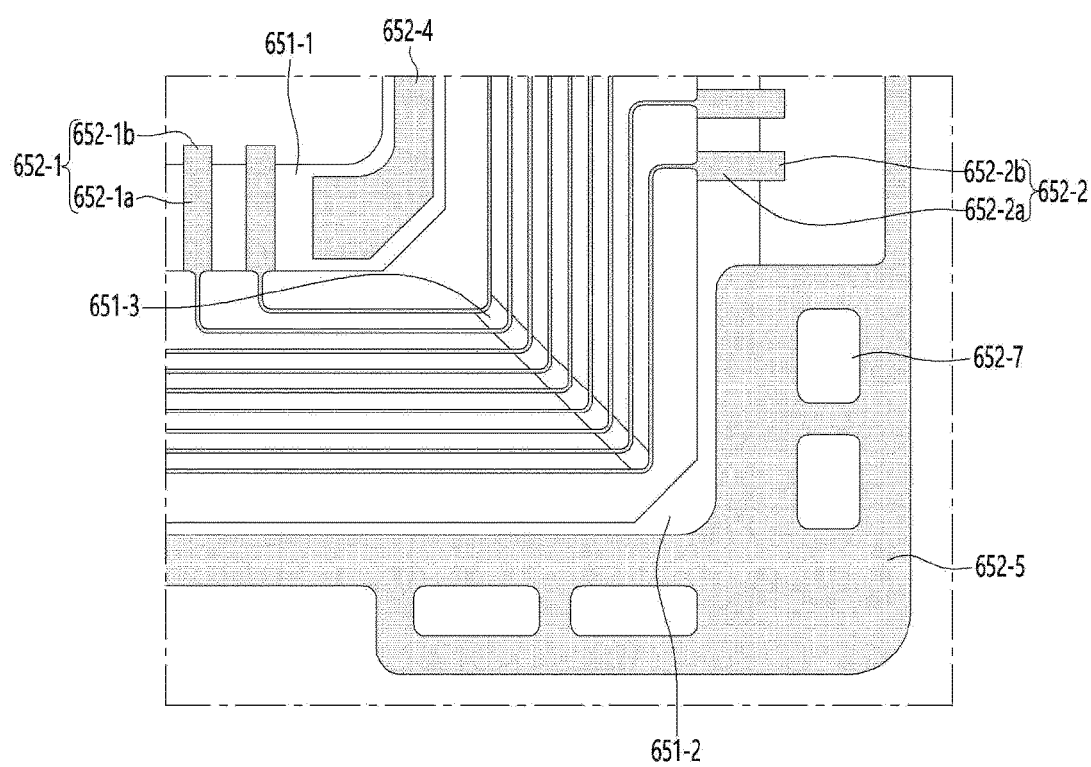
FIG. 19c is an enlarged view of a partial region of the fourth substrate.
Figure 20:
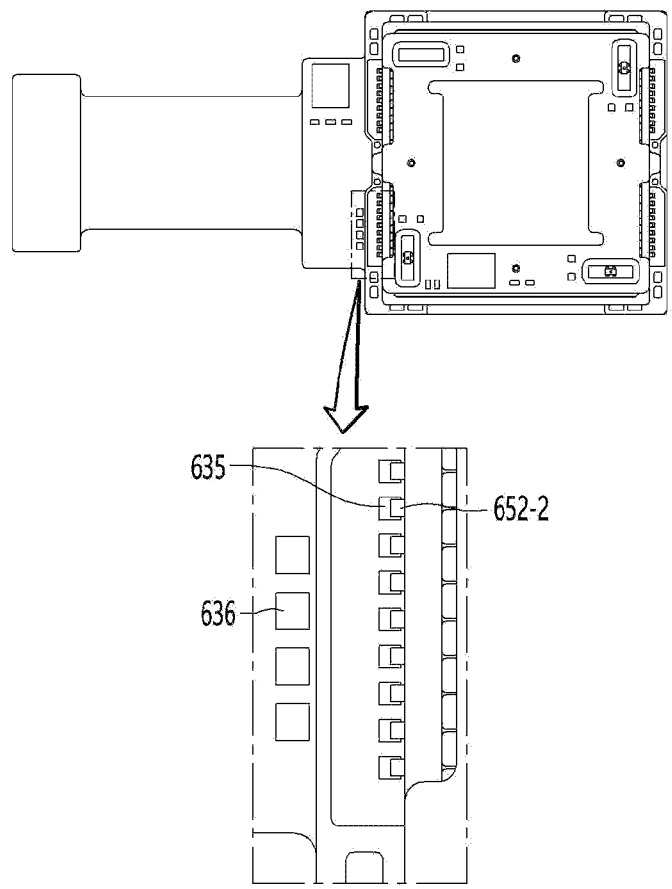
FIG. 20 is a view illustrating a coupling between the first substrate and the fourth substrate according to an embodiment.
Figure 21:
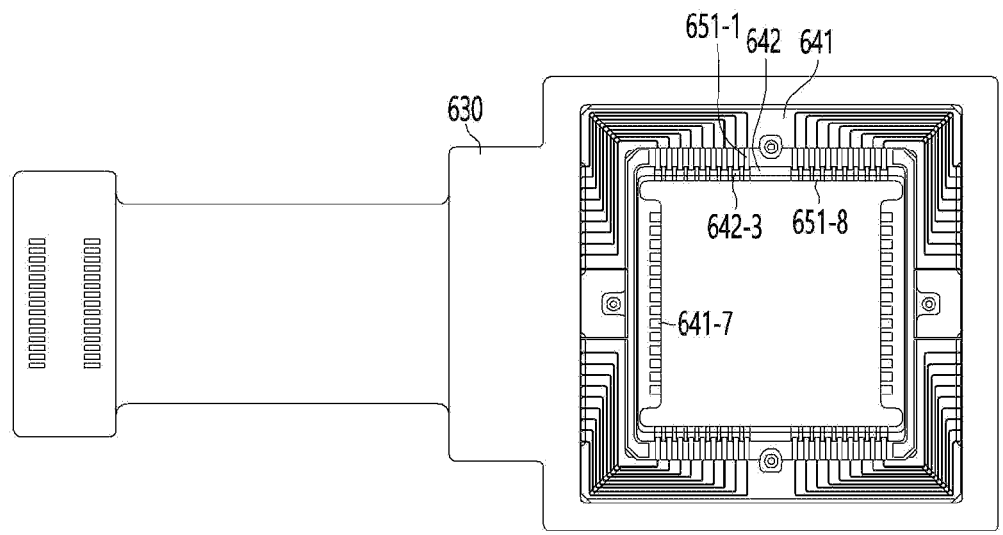
FIG. 21 is a view illustrating a coupling between first to fourth substrates according to an embodiment.

FIG. 9a is an exploded perspective view of a second actuator according to a first embodiment, FIG. 9b is an exploded perspective view of a second actuator according to a second embodiment, FIG. 10 is a perspective view illustrating a housing shown in FIG. 9, FIG. 11 is an exploded perspective view of a holder shown in FIG. 9, FIG. 12 is a view showing a damping plate shown in FIG. 11, FIG. 13 is a perspective view of a first substrate shown in FIG. 9, FIG. 14 is an exploded perspective view of a coil moving substrate portion shown in FIG. 9, FIG. 15 is a bottom view of a second substrate of the coil moving substrate portion shown in FIG. 14, FIG. 16 (*a*) is a plan view of a third substrate of the coil moving substrate portion shown in FIG. 14, FIG. 16 (*b*) is a bottom view of the third substrate of the coil moving substrate portion shown in FIG. 14, FIG. 17 is a coupling view of a second substrate and a third substrate according to an embodiment, FIG. 18 is an exploded perspective view of a fourth substrate shown in FIG. 9, FIG. 19a is a plan view of the fourth substrate shown in FIG. 9, FIG. 19b is a bottom view of the fourth substrate shown in FIG. 9, FIG. 19c is an enlarged view of a partial region of the fourth substrate, FIG. 20 is a view illustrating a coupling between the first substrate and the fourth substrate according to an embodiment, and FIG. 21 is a view illustrating a coupling between first to fourth substrates according to an embodiment.

Referring to FIGS. 9 to 21, the second actuator 600 includes a fixed portion and a moving portion. In this case, the fixed portion of the second actuator 600 may include a housing 610, a holder portion 620, and a portion of the substrate portion 630, 640, and 650. In addition, the moving portion of the second actuator 600 may include the other portion of the substrate portion 630, 640, and 650. The substrate portion 630, 640, and 650 include a coil moving substrate portion 640 including a first substrate 630, a second substrate 641, and a third substrate 642, and a fourth substrate 650.

In addition, the first substrate 630 of the substrate portion 630, 640, and 650 may be a fixed portion of the second actuator 600. In addition, the coil moving substrate portion 640 including the second substrate 641 and the third substrate 642 of the substrate portion 630, 640, and 650 may be a moving portion of the second actuator 600. In addition, the fourth substrate 650 may be a fixed portion, or, alternatively, may be a moving portion. That is, a part of the fourth substrate 650 may be a fixed portion, and the other part of the fourth substrate 650 may be a moving portion. In addition, the fourth substrate 650 may include a connection portion connecting the fixed portion of the fourth substrate and the moving portion of the fourth substrate.

Preferably, an outer frame (described later) of the fourth substrate 650 may be connected to the first substrate 630 to function as a fixed portion, and an inner frame of the fourth substrate 650 may be coupled to the coil moving substrate portion 640 including the second substrate 641 and the third substrate 642 to function as a moving portion. This will be described in more detail below.

Also, the second actuator 600 may include a housing 610. The housing 610 may have an accommodating space for accommodating some or all of components constituting the second actuator 600 therein. For example, the housing 610 may accommodate a portion of the first substrate 630, the second substrate 641, the holder portion 620, the third substrate 642, and the fourth substrate 650, and some of these components may be omitted or some may be disposed outside the housing 610.

The second actuator 600 as described above will be described in detail as follows.

—Housing—

The housing 610 may include a bottom portion 611 having a first opening 612 formed in a center thereof, and a sidewall portion 613 protruding from an edge region of the bottom portion 611. Accordingly, the housing 610 may have a shape in which a first opening 612 is formed on the lower surface and upper side is opened.

At least a portion of the side wall portion 613 of the housing 610 may be opened. Preferably, at least a portion of the sidewall portion 613 of the housing 610 may include an exposing portion 616. In addition, the exposing portion 616 allows a portion of the first substrate 630 accommodated in the housing 610 to be exposed to the outside of the housing 610. Preferably, a portion of the first substrate 630 may be disposed inside the housing 610, and the remaining portion may be disposed outside the housing 610 through the exposing portion 616.

The housing 610 may include a plurality of first guide protrusions 614 formed in a region adjacent to an inner side of the bottom portion 611. The first guide protrusions 614 may be disposed to be spaced apart from each other by a predetermined distance, thereby guiding an arrangement position of the first substrate 630 on the bottom portion 611 of the housing 610.

In addition, the housing 610 may include a coupling groove 615 recessed in the downward direction on the upper surface of the side wall portion 613.

A plurality of coupling grooves 615 may be formed in the sidewall portion 613. Preferably, the plurality of coupling grooves 615 may be formed on the sidewall portion 613 to face each other. For example, each of the plurality of coupling grooves 615 may be disposed on the plurality of sidewall portions 613 facing each other.

Preferably, a groove corresponding to the coupling groove 615 is formed on the holder portion 620 while overlapping the coupling groove 615 in the optical axis. In addition, a bonding member (not shown) may be disposed in the groove formed in the holder portion 620 and the coupling groove 615 formed in the housing 610. That is, when the holder portion 620 and the housing 610 are coupled, a soldering process may be performed in the groove formed in the holder portion 620 and the coupling groove 615, and accordingly, the bonding member may be disposed in the coupling groove 615 by the soldering process.

—Holder Portion—

A holder portion 620 is disposed on the housing 610.

In this case, the holder portion 620 may have a different structure depending on the embodiment. For example, the holder portion 620 in the first embodiment may include only a holder 621 and a magnet portion 623. Preferably, a damping plate 622 may be omitted from the holder portion 620 in the first embodiment, and accordingly, a connection wire 624 may also be omitted.

Preferably, the connection wire 624 is omitted in the camera module in the first embodiment, and accordingly, a through hole formed for the connection wire 624 to pass through among the components constituting the second actuator may also be omitted.

In addition, the camera module in the second embodiment may include a connection wire 624, and accordingly, the second actuator may include a damping plate 622 to which the connection wire 624 is coupled, and through-holes through which the connection wire 624 passes.

Hereinafter, the holder portion 620 of the second embodiment will be mainly described. At this time, the damping plate of the holder portion of the second embodiment is omitted from the holder portion in the first embodiment, and accordingly, the connection wire 624 and the through-hole formed to pass through the connection wire 624 may also be omitted.

The holder portion 620 may include a holder 621, a damping plate 622, and a magnet portion 623.

The holder 621 may be a magnet holder in which the magnet portion 623 is disposed.

Also, the holder 621 may be a damping plate holder on which the damping plate 622 is disposed.

The holder 621 may include a frame 621a having a second opening 621-1 formed in a center and disposed on the housing 610, and a protruding portion 621b extending downwardly from a lower end of the frame 621a.

The frame 621a of the holder 621 may be disposed to partially cover an open upper region of the housing 610. The frame 621a may have a plate shape in which the second opening 621-1 is formed in the center. The second opening 621-1 may be aligned with the first opening 612 on the optical axis.

The protruding portion 621b may be disposed on a lower surface of the frame 621a in a region corresponding to the exposing portion 616 of the housing 610. The protruding portion 621b may extend downward from the frame 621a and may be disposed in the exposing portion 616 of the housing 610. Preferably, the protruding portion 621b may cover a portion of an opening the exposing portion 616 of the housing 610. That is, a region 621-5 corresponding to a second part of the exposing portion 616 in the second frame 621b may be opened.

That is, an area of the protruding portion 621b may be smaller than an area of the exposing portion 616. Accordingly, the protruding portion 621b may be disposed to cover only the first part of the exposing portion 616. In addition, the second part of the exposing portion 616 excluding the first part may maintain an open state in the state in which the holder 621 is disposed on the housing 610. The region 621-5 of the protruding portion 621b and the second part of the exposing portion 616 may be aligned with the second open region 320 of the first case 300 in a direction perpendicular to the optical axis. Accordingly, the second part of the exposing portion 616 may expose a terminal 262 of the flexible circuit board 260 of the first actuator 200 together with the second open region 320 of the first case 300.

A first seating portion 621-2 may be provided on the frame 621a of the holder 621. The first seating portion 621-2 may be a stepped protrusion or a step surface provided on an inner upper surface of the frame 621a.

A first recess 621-3 in which the elastic parts 622-2 and 622-3 of the damping plate 622 are disposed is formed in the first seating portion 621-2 of the holder 621. A plurality of the first recesses 621-3 may be formed to be spaced apart from each other by a predetermined interval on the first seating portion 621-2.

Also, a first through hole 621-4 into which a connection wire 624 is inserted may be formed in the first recess 621-3.

A damping plate 622 may be disposed on the first seating portion 621-2 of the holder 621. The damping plate 622 includes a plate portion 622-1 disposed on the first seating portion 621-2, and elastic parts 622-2 and 622-3 extending from the plat portion 622-1 and disposed on the first recess 621-3.

The elastic parts 622-2 and 622-3 may be integrally formed with the plate portion 622-1. However, the elastic parts 622-2 and 622-3 may extend from the plate portion 622-1 and include a bending region bent at least once.

Preferably, the elastic parts 622-2 and 622-3 extend from a first elastic part 622-2 including a bending region that is bent at least once, and a second elastic part 622-3 extending from the first elastic part 622-2 and having a hole formed in a region corresponding to the first through hole 621-4. That is, the hole formed in the second elastic part 622-3 and the first through hole 621-4 of the holder 621 may be holes through which the connection wire 624 passes.

In addition, one end of the connection wire 624 may be coupled to the second elastic part 622-3 of the damping plate 622 by soldering.

As described above, the elastic parts 622-2 and 622-3 of the damping plate 622 include the first elastic part 622-2 and the second elastic part 622-3, and accordingly, the elastic part may be selectively bent in an operating environment of the actuator.

At this time, when the elastic parts 622-2 and 622-3 of the damping plate 622 do not have elasticity, the connection wire 624 may move together when the image sensor module 400 is moved to cause warpage, and breakage may occur depending on the degree of occurrence of the warpage. Alternatively, the elastic parts 622-2 and 622-3 of the damping plate 622 of the embodiment are bent, thereby, it can serve as a suspense when the image sensor module 400 moves, and accordingly, it is possible to increase the rigidity of the connection wire 624 by imparting elasticity to the connection wire 624.

One end of the connection wire 624 as described above is coupled to the elastic parts 622-2 and 622-3 of the damping plate 622. In addition, the connection wire 624 may pass through the first through hole 621-4 of the holder 621 to extend in a downward direction of the holder 621, for example, a direction in which the bottom portion 611 of the housing 610 is positioned.

The connection wire 624 may have one end connected to the damping plate 622 and the other end connected to the coil moving substrate portion 640. In this case, the damping plate 622 is a fixed portion of the second actuator 600, and the coil moving substrate portion 640 is a moving portion of the second actuator 600. In this case, when the image sensor module 400 shifts according to the shift of the coil moving substrate portion 640 in a state in which the connection wire 624 does not exist, a tilt of the image sensor module 400 may occur due to elasticity of the coil moving substrate portion 640 or the fourth substrate 650 regardless of the direction in which the shift occurs. Accordingly, the fourth substrate 650 may be referred to as an elastic member disposed between the fixed portion and the moving portion to elastically move the moving portion.

Accordingly, the connection wire 624 may be connected to the damping plate 622, and the other end may be connected to the coil moving substrate portion 640 to support the coil moving substrate portion 640. Preferably, the connection wire 624 suppresses a tilt phenomenon that occurs when the coil moving substrate portion 640, further the fourth substrate 650, and further the image sensor module 400 is shifted. Here, the tilt phenomenon may include a phenomenon in which the image sensor module 400 sags downward due to elasticity of the fourth substrate 650. In addition, the connection wire 624 may prevent the coil moving substrate portion 640 from sagging in the downward direction. That is, the coil moving substrate portion 640 may be shifted while being suspended from the holder portion 620 through the connection wire 624, thereby minimizing a tilt phenomenon.

The connection wire 624 may have elasticity. The connection wire 624 may be an elastic member. The connection wire 624 may be a wire spring. As described above, the connection wire 624 may connect the damping plate 622 to the third substrate 642 of the coil moving substrate portion 640 in a state in which the holder portion 620 and the coil moving substrate portion 640 are spaced apart by a predetermined distance. The connection wire 624 may be formed of metal. The connection wire 624 may elastically support the movement of the coil moving substrate portion 640.

The connection wire 624 may include a plurality of wires. The connection wire 624 may be evenly distributed on the four side surfaces. That is, the connection wire 624 may form a mutually symmetrical structure with the sides facing each of the four sides. In this case, the connection wire 624 should elastically support the coil moving substrate portion 640. Here, when the connection wire 624 is disposed to have an asymmetric structure and the coil moving substrate portion 640 shifts, a difference occurs in the amount of movement or tilt in a portion with a relatively large number of connection wires and a portion other than this, and thus, a problem in operation reliability may occur. Accordingly, the connection wire 624 in the embodiment is uniformly disposed in each region to improve the reliability of the image sensor shift operation. On the other hand, although it is illustrated that there are 4 connection wires 624 in the drawing, this is only an embodiment, and has the above-described symmetrical structure and may be increased to 8 or 12.

Meanwhile, a magnet seating portion (not shown) in which a magnet portion 623 is disposed may be formed on a lower surface of the frame 621*a* of the holder 621. The magnet portion 623 may be disposed on the magnet seating portion of the holder 621.

The magnet portion 623 may be disposed to face a coil portion (described later) disposed on the coil moving substrate portion 640. In this case, when a current is applied to the coil portion, an electric field may be formed around the coil portion. When a current is applied to the coil portion, the coil portion may move relative to the magnet portion 623 through electromagnetic interaction between the coil portion and the magnet portion 623.

The magnet portion 623 may be disposed on a corner of a lower surface of the holder 621. That is, the magnet portion 623 may be disposed on four corners of the lower surface of the holder 621. In addition, the magnet portion 623 may face the coil portion of the coil moving substrate portion 640. The magnet portion 623 may be a flat magnet having a flat plate shape.

The magnet portion 623 may include a plurality of magnets. The magnet portion 623 may include four magnets. The magnet portion 623 may include first to fourth magnets 623-1, 623-2, 623-3, and 623-4.

The first magnet 623-1 may face the first coil 641-2*a* disposed on the second substrate 641 of the coil moving substrate portion 640. The first magnet 623-1 may be disposed on a first corner formed on an upper left side of the holder 621.

The second magnet 623-2 may face the second coil 641-2*b* disposed on the second substrate 641 of the coil moving substrate portion 640. The second magnet 623-2 may be disposed on a second corner formed on an upper right side of the holder 621.

The third magnet 623-3 may face the third coil 641-2*c* disposed on the second substrate 641 of the coil moving substrate portion 640. The third magnet 623-3 may be disposed on a third corner formed on a lower right side of the holder 621.

The fourth magnet 623-4 may face the fourth coil 641-2*d* disposed on the second substrate 641 of the coil moving substrate portion 640. The fourth magnet 623-4 may be disposed on a fourth corner formed on a lower left side of the holder 621.

Each of the magnets constituting the magnet portion 623 may be disposed perpendicularly to an adjacent magnet, and may be disposed parallel to a magnet disposed in a diagonal direction Here, a polarity of a surface of the first magnet 623-1 facing the coil portion 641-2 may be different between a portion close to one side and a portion close to the other side. In addition, a polarity of a surface of the second magnet 623-2 facing the coil portion 641-2 may be different between a portion close to one side and a portion close to the other side. In addition, a polarity of a surface of the third magnet 623-3 facing the coil portion 641-2 may be different between a portion close to one side and a portion close to the other side. Also, a polarity of a surface of the fourth magnet 623-4 facing the coil portion 641-2 may be different between a portion close to one side and a portion close to the other side.

Also, the first magnet 623-1 and the third magnet 623-3 may be disposed in the same direction. Also, the second magnet 623-2 and the fourth magnet 623-4 may be disposed in the same direction.

The first magnet 623-1 may be vertically disposed with the second magnet 623-2. Inner portions of the first to fourth magnets 623-1, 623-2, 623-3, and 623-4 may have the same polarity. Outer portions of the first to fourth magnets 623-1, 623-2, 623-3, and 623-4 may have the same polarity. The polarity of each inner portion of the first to fourth magnets 623-1, 623-2, 623-3, and 623-4 may be formed as an N-pole. The polarity of each outer portion of the first to fourth magnets 623-1, 623-2, 623-3, and 623-4 may be formed as an S-pole. However, as a modification, the polarity of each inner portion of the first to fourth magnets 623-1, 623-2, 623-3, and 623-4 may be formed as an S-pole, and the polarity of each outer portion of the first to fourth magnets 623-1, 623-2, 623-3, and 623-4 may be formed as an N-pole.

—First Substrate—

The first substrate 630 may include a first region 631 having a third opening 631*a* formed in a center and a second region 632 extending from the first region 631 and in which a connector connected to an external device is disposed.

The first substrate 630 may include a first terminal portion 635 disposed in the first region 631. The first terminal portion 635 may be connected to a second lead pattern portion 652-2 of a fourth substrate 650 to be described later. For example, the second lead pattern portion 652-2 of the fourth substrate 650 is disposed on the first terminal portion 635 of the first substrate 630, and accordingly, the second lead pattern portion 652-2 and the first terminal portion 635 may be electrically connected to each other through a soldering process.

Preferably, the first terminal portion 635 may be disposed around the third opening 631*a* among the upper surfaces of the first region 631. The first terminal portion 635 may be referred to as a pad electrically connected to the second lead pattern portion 652-2 of the fourth substrate 650.

The first terminal portion 635 may include a plurality of terminals. The first terminal portion 635 may include a plurality of first terminals. For example, the first terminal portion 635 may include a plurality of first-first terminals 635-1 disposed on one side of the third opening 631*a* of the first region 631, and a plurality of first-second terminals 635-2 disposed on the other side opposite to one side of the third opening 631*a* of the first region 631.

The number of terminals of the first terminal portion 635 may be equal to or greater than the number of patterns of the second lead pattern portion 652-2. When the number of first terminals constituting the first terminal portion 635 is the same as the number of second lead patterns constituting the second lead pattern portion 652-2, all of the first terminals are the second leads patterns can be connected. In addition, when the number of first terminals constituting the first terminal portion 635 is greater than the number of second lead patterns constituting the second lead pattern portion 652-2, some of the first terminals may be connected to the second lead pattern. In addition, some of the remaining first terminals may function as test terminals for testing a connection state or the like.

A connector may be disposed on a second region 632 connected to the first region 631. The connector may be a port for electrically connecting to an external device.

The first region 631 may be disposed inside the camera device, and the second region 632 may extend from the first region 631 to be exposed to the outside of the camera device.

For example, the first region 631 is disposed inside the housing 610, and the second region 632 may be disposed outside the housing 610 through the exposing portion 616 of the housing 610, and the connector connected to an external device may be disposed on the externally disposed region.

The first substrate 630 may transmit a signal to the fourth substrate 650 or receive a signal transmitted from the fourth substrate 650. The first substrate 630 is electrically connected to the first pattern portion 652*a* of the fourth substrate 650, and thus transmits a power signal or a communication signal to the fourth substrate 650, and image information including an image signal obtained through the sensor module 400 may be received.

For example, the image sensor module 400 is coupled to the third substrate 642 of the coil moving substrate portion 640. In addition, the third substrate 642 is coupled to the second substrate 641 of the coil moving substrate portion 640. In addition, the first pattern portion 652*a* of the fourth substrate 650 is coupled to the third substrate 642. That is, the first lead pattern portion 652-1 of the first pattern portion 652*a* of the fourth substrate 650 is coupled to the third substrate 642. In addition, the first pattern portion 652*a* of the fourth substrate 650 is coupled to the first substrate 630. That is, the second lead pattern portion 652-2 of the first pattern portion 652*a* of the fourth substrate 650 is coupled to the first substrate 630.

Meanwhile, the image signal acquired through the image sensor module 400 is transmitted to the second substrate 641. At this time, the image signal may be provided to the third substrate 642 connected to the second substrate 641, this may be again provided from the third substrate 642 to the fourth substrate 650, and this may be again provided to the first substrate 630.

In addition, the power signal or communication signal transferred from the first substrate 630 to the second substrate 641 may be transferred to the second substrate 641 through the fourth substrate 650 and the third substrate 642.

The first substrate 630 may include a second terminal portion 636 disposed on an edge region of the first region 631. The second terminal portion 636 may be electrically connected to the flexible circuit board 260 included in the first actuator 200.

The first substrate 630 may be seated on the housing 610 by the first guide protrusion 614 of the housing 610. The first substrate 630 may be positioned in a fixed state on the housing 610. That is, the first substrate 630 may maintain a fixed position without moving when the second actuator 600 is driven.

Meanwhile, it has been described above that the first region 631 of the first substrate 630 is disposed in the housing 610. However, a portion of the first region 631 may be substantially disposed in the housing 610, and the remaining portion may be exposed to the outside of the housing 610 together with the second region 632. In addition, a gyro sensor 633 may be disposed on the exposed portion of the first region 631.

In addition, a passive device 634 may be disposed in the exposed portion of the first region 631.

That is, a gyro sensor 633 for implementing an anti-shake function is disposed on the first substrate 630 in the present exemplary embodiment. In addition, the first substrate 630 may feedback angular velocity/linear velocity detection information due to hand shake to the coil moving substrate portion 640 using information obtained through the gyro sensor 633.

—Coil Moving Substrate Portion—

The coil moving substrate portion 640 may be disposed under the holder portion 620 in the housing 610. The coil moving substrate portion 640 may be supported by the holder portion 620 through the connection wire 624 at a position spaced apart from the holder portion 620 by a predetermined interval.

That is, the connection wire 624 has one end coupled to the damping plate 622 constituting the holder portion 620, and the other end coupled to the coil moving substrate portion 640 disposed below the holder portion 620. The connection wire 624 may prevent the coil moving substrate portion 640 from being tilted in a direction other than the moving direction when the second actuator 600 is driven. That is, the connection wire 624 may prevent the coil moving substrate portion 640 from being tilted in the optical axis direction independent of the shift direction. That is, the coil moving substrate portion 640 may move relative to the holder portion 620 or the lens portion 100 by the interaction between the magnet portion 623 and the coil portion 641-2, in a state supported by the holder portion 620 through the connection wire 624. The coil moving substrate portion 640 may also be referred to as a sensor moving portion that moves the image sensor.

To this end, the coil moving substrate portion 640 may include a second substrate 641, a third substrate 642, and a substrate holder 643. Here, the second substrate 641 and the third substrate 642 may be substrate portions constituting the coil moving substrate portion 640, and furthermore, it may be a moving portion that moves when the second actuator 600 is driven.

The second substrate 641 may be a main substrate. The second substrate 641 may be a driving substrate for driving the second actuator 600.

The second substrate 641 may include a fourth opening 641*a*. The fourth opening 641*a* may overlap the third opening 631*a* formed in the first substrate 630 in the optical axis direction.

The second substrate 641 may include a coupling hole 641*b* extending outwardly of the second substrate 641 in an edge region of the fourth opening 641*a*. When coupled to the substrate holder 643, a coupling protrusion 643-5 included in the substrate holder 643 may be inserted into the coupling hole 641*b*. That is, the coupling hole 641*b* may increase coupling force with the substrate holder 643 while guiding a coupling position of the substrate holder 643 disposed on the second substrate 641. In addition, a recessed portion 641*c* that is spaced apart from each other by a predetermined distance and recessed in an inward direction of the second substrate 641 may be formed on the outer surface of the second substrate 641. The recessed portion 641*c* may be an exposing portion exposing a portion of a component disposed under the second substrate 641. For example, a lower portion of the second substrate 641 is a region in which the terminal portion of the first substrate 630 and the lead pattern portion of the fourth substrate 650 are soldered. Accordingly, the recessed portion 641*c* may be formed to secure a soldering region for connection between the first substrate 630 and the fourth substrate 650.

The second substrate 641 may include coil portions 641-2 disposed on respective corners thereof.

The coil portion 641-2 may be electrically connected to circuit patterns (not shown) included in the second substrate 641. The coil portion 641-2 may be disposed to face the magnet portion 623 disposed on the holder portion 620. In addition, when a current is applied to the coil portion 641-2, an electric field may be formed around the coil portion 641-2.

The coil portion 641-2 may include four coils. In this case, current may be independently applied to at least three coils of the four coils. In the first embodiment, the coil portion 641-2 may be controlled by three channels. Alternatively, in the embodiment, the coil portion 641-2 may be controlled by four individual channels. The four coils constituting the coil portion 641-2 may be electrically separated from each other. Any one of the forward current and the reverse current may be selectively applied to each of the four coils of the coil portion 641-2. In the present embodiment, only three of the four coils may be electrically separated and one coil may be electrically connected to another coil. Alternatively, all four coils of the coil portion 641-2 may be electrically separated. When only three of the four coils are electrically separated, a total of six lead wires in three pairs may come out of the coil portion 641-2, and when all four coils are electrically separated, a total of eight lead wires in four pairs may come out of the coil portion 641-2.

When four coils are controlled by three channels as in the first embodiment of the present embodiment, a pair of the coil portion 641-2 and the magnet portion 623 should be driven in a z-axis-centered rotational drive, but when four coils are controlled by four channels as in the embodiment, the coil portion 641-2 and the magnet portion 623 may be driven in two pairs in the z-axis-centered rotational drive.

The coil portion 641-2 may include first to fourth coils 641-2*a*, 641-2*b*, 641-2*c*, 641-2*d*. In addition, each of the first to fourth coils 641-2*a*, 641-2*b*, 641-2*c*, 641-2*d* may be disposed to face each magnet of the magnet portion 623 disposed on the holder portion 620.

The first coil 641-2*a* may be disposed on a first corner of the second substrate 641. The second coil 641-2*b* may be disposed on a second corner of the second substrate 641. The third coil 641-2*c* may be disposed on a third corner of the second substrate 641. The fourth coil 641-2*d* may be disposed on a fourth corner of the second substrate 641. The first coil 641-2*a* and the third coil 641-2*c* may be disposed on a first diagonal direction of the second substrate 641, and the second coil 641-2*b* and the fourth coil 641-2*d* may be disposed on a second diagonal direction of the second substrate 641.

In the present embodiment, the first coil 641-2*a* and the third coil 641-2*c* may be disposed to be elongated in a first direction, and the second coil 641-2*b* and the fourth coil 641-2*d* may be disposed to be elongated in a second direction. In this case, the first direction and the second direction may be vertical. A long side of the first coil 641-2*a* and a long side of the third coil 641-2*c* may be disposed in parallel with each other. A long side of the second coil 641-2*b* and a long side of the fourth coil 641-2*d* may be disposed in parallel to each other. The long side of the first coil 641-2*a* and the long side of the second coil 641-2*b* may not be parallel to each other. In this case, the long side of the first coil 641-2*a* and the long side of the second coil 641-2*b* may be disposed such that the virtual extension lines thereof are orthogonal to each other. A disposition direction of the first coil 641-2*a* and a disposition direction of the second coil 641-2*b* may be orthogonal to each other In the present embodiment, a current may be independently applied to at least three coils among the first to fourth coils 916-1, 916-2, 916-3, and 916-4. The first to fourth coils 916-1, 916-2, 916-3, and 916-4 may be electrically separated from each other.

Meanwhile, hall sensors 917 may be disposed at inner sides of the first to fourth coils 641-2*a*, 641-2*b*, 641-2*c* and 641-2*d*. In this case, the hall sensors 641-3 may be disposed only at inner sides of three coils among the first to fourth coils 641-2*a*, 641-2*b*, 641-2*c* and 641-2*d*. This is because, in the first embodiment, since the first to fourth coils 641-2*a*, 641-2*b*, 641-2*c* and 641-2*d* are controlled by three channels, one coil may not necessarily have a hall sensor. The hall sensor 641-3 may sense a magnetic force of the magnet portion 623. A movement of the image sensor module may be identified in real time via a magnetic force of the magnet portion 623 sensed by the hall sensor 641-3. In addition, this may allow an optical image stabilization (OIS) feedback control.

The hall sensor 641-3 may be configured in plural. That is, as described above, the hall sensor 641-3 may include three sensors. A movement in the x-axis direction, a movement in the y-axis direction, and a rotation around the z-axis of the image sensor 440 may be sensed through the three sensors. The hall sensor 641-3 may include first to third sensors. The first sensor may face the first magnet, the second sensor may face the second magnet, and the third sensor may face the third magnet.

The hall sensor 641-3 may include a first hall sensor for sensing an x-axis movement amount and/or displacement of the magnet portion 623. The hall sensor 641-3 may include a second hall sensor for sensing a y-axis movement amount and/or displacement of the magnet portion 623. The hall sensor 641-3 may include a third hall sensor for sensing the x-axis movement amount and/or displacement or the y-axis movement amount and/or displacement of the magnet portion 623. A movement of the magnet portion 623 rotating around the z-axis may be sensed through at least two of the first hall sensor, the second hall sensor, and the third hall sensor.

A driver IC 641-4 for controlling an operation of the second actuator may be disposed on the second substrate 641. In addition, various passive devices 641-5 for operating the second actuator may be disposed on the second substrate 641.

In this case, the second substrate 641 should connect the coil portion 641-2, the driver IC 641-4, and the passive devices 641-5 to each other, and then to the first substrate 630. Here, a terminal may be in twelve required for the electrical connection from the second substrate 641 to the first substrate 630. The twelve terminals may be terminals connected to the driver IC 641-4. In this case, 4 of the 12 terminals may be connected to each other. Accordingly, the four terminals may be constituted by one terminal. Accordingly, when connecting between the first substrate 630 and the second substrate 641, there may be eight terminals required for connection with the driver IC 641-4.

In addition, the number of terminals required for electrical connection with the image sensor module 400 on the second substrate 641 may be 28. In addition, the second substrate 641 must transmit the image signal acquired through the image sensor module 400 to the first substrate 630. Accordingly, in the connection between the first substrate 630 and the second substrate 641, there may be 28 terminals required for transmission of the image signal.

The third terminal portion 641-8 is disposed on the lower surface of the second substrate 641 and is connected to the driver IC 641-4, or transfers the image signal acquired through the image sensor module 400 to the first substrate 630. The third terminal portion 641-8 may be a pad for electrical connection with the first substrate 630. Preferably, the first substrate 630 and the second substrate 641 do not directly exchange signals with each other, but exchange signals through the third substrate 642 disposed in a middle. Accordingly, the third terminal portion 641-8 may be a pad for electrical connection with the third substrate 642. Preferably, the third terminal portion 641-8 may be connected to the second substrate 641 to transfer a signal (eg, a control signal) generated from the first substrate 630 to the second substrate 641 or transfer a signal (eg, an image signal) generated from the second substrate 641 to the first substrate 630.

Meanwhile, the third terminal portion 641-8 may be disposed in a plurality of regions on the lower surface of the second substrate 641. For example, the third terminal portion 641-8 may include a third-first terminal part 641-8*a* disposed on a first side of the fourth opening 641*a* of the lower surface of the second substrate 641, and a third-second terminal part 641-8*b* disposed on a second side facing the first side.

In addition, a fourth terminal portion 641-7 to which the image sensor module 400 is coupled may be formed on a lower surface of the second substrate 641. The fourth terminal portion 641-7 may be disposed on a plurality of regions on the lower surface of the second substrate 641.

That is, the fourth terminal portion 641-7 may include a fourth-first terminal part 641-7*a* and a fourth-second terminal part 641-7*b* disposed in a region facing each other on a lower surface of the fourth opening 641*a* with the fourth opening 641*a* interposed therebetween. At this time, the fourth terminal portion 641-7 may be connected to the image sensor module 400 to receive an image signal transmitted through the image sensor module 400 or receive a signal other than the image signal.

In this case, when the terminal for receiving the image signal and the terminal for receiving other signals are disposed on the same region of the lower surface of the second substrate 641, the image signal may include a noise signal. Therefore, the fourth-first terminal part 641-7*a* to which the image signal is transmitted and the fourth-second terminal part 641-7*b* to which other signals are transmitted among the fourth terminal portion 641-7 connected to the image sensor module 400 are disposed in different region, and accordingly, the quality of the image signal can be improved.

Meanwhile, a second through hole 641-6 may be formed in the second substrate 641. In this case, the second through hole 641-6 may be aligned and arranged with the first through hole 621-4 formed in the holder 621 in the optical axis direction. The second through hole 641-6 may be a wire through hole through which the connection wire 624 coupled to the damping plate 622 passes.

A third substrate 642 may be disposed under the second substrate 641. The third substrate 642 may relay an electrical connection between the first substrate 630, the second substrate 641, and the fourth opening 641*a*.

In this case, a substrate holder 643 may be disposed between the second substrate 641 and the third substrate 642.

The substrate holder 643 may be disposed between the second substrate 641 and the third substrate 642 to increase the bonding force between the second substrate 641 and the third substrate 642.

A fifth opening 643-1 may be formed in a center of the substrate holder 643. The fifth opening 643-1 may be aligned with the fourth opening 641*a* formed in the second substrate 641 in the optical axis direction.

In addition, the substrate holder 643 may include a protrusion 643-2 extending outwardly on an edge region. The protrusion 643-2 may be formed to protrude outward from the side surface of the substrate holder 643. The protrusion 643-2 may be seated on an upper surface of the second substrate 641 so that a lower surface of the protrusion 643-2 is in contact with the upper surface of the second substrate 641. In this case, the protrusion 643-2 may be configured in plurality, so that the substrate holder 643 can be stably seated on the second substrate 641.

Meanwhile, the protrusion 643-2 formed on the substrate holder 643 may be disposed in a region overlapping the second through hole 641-6 formed in the second substrate 641 in the optical axis direction. Accordingly, the protrusion 643-2 may include a recess 643-3 that is recessed inwardly to expose the second through hole 641-6.

In addition, the substrate holder 643 may include a coupling protrusion 643-5 formed in a region corresponding to the coupling hole 641b of the second substrate 641. The coupling protrusion 643-5 may be a protrusion protruding downward from the lower surface of the substrate holder 643.

Meanwhile, a connection protrusion 643-4 connecting an outer surface of the substrate holder 643 and the coupling protrusion 643-5 may be formed on the outer surface of the substrate holder 643. The connection protrusion 643-4 may be formed to protrude outward from the outer surface of the substrate holder 643 in order to secure a region in which the coupling protrusion 643-5 can be formed on the lower surface of the substrate holder 643.

In addition, the third substrate 642 may be coupled to the substrate holder 643 under the second substrate 641. An opening may also be formed in a center of the third substrate 642, and the opening may be aligned with openings of the second substrate 641, the third substrate 642, the first actuator, etc. in the optical axis direction As shown in (a) of FIG. 16, the third substrate 642 may include a fifth terminal portion 642-2 formed on an upper surface of the third substrate 642. The fifth terminal portion 642-2 may face the third terminal portion 641-8 formed on the lower surface of the second substrate 641. That is, the fifth terminal portion 642-2 may be arranged to be aligned with the third terminal portion 641-8 formed on the second substrate 641 in the optical axis direction. In addition, the fifth terminal portion 642-2 may include terminals corresponding to the number of terminals of the third terminal portion 641-8. The fifth terminal portion 642-2 and the third terminal portion 641-8 may be electrically connected to each other through soldering.

In this case, the fifth terminal portion 642-2 may include a fifth-first terminal part 642-2a connected to the third-first terminal part 641-8a of the third terminal portion 641-8, and a fifth-second terminal part 642-2b connected to the third-second 641-8b.

Also, as shown in (b) of FIG. 16, the third substrate 642 may include a sixth terminal portion 642-3 formed on a lower surface thereof. The sixth terminal portion 642-3 may be electrically connected to a first pattern portion 652a of a fourth substrate 650, which will be described later. More preferably, the sixth terminal portion 642-3 may be coupled to the first lead pattern portion 652-1 of the first pattern portion 652a of the fourth substrate 650. That is, the fourth substrate 650 is disposed under the sixth terminal portion 642-3, and further, is positioned under the first lead pattern portion 652 among the first pattern portion 652a of the fourth substrate 650. In addition, the sixth terminal portion 642-3 may be coupled and electrically connected to the first lead pattern portion 652-1 through soldering.

In this case, the fifth terminal portion 642-2 and the sixth terminal portion 642-3 may be aligned with each other in the optical axis direction. That is, some of the fifth terminal portion 642-2 and the sixth terminal portion 642-3 receive the image signal transmitted from the second substrate 641, and transfers the received image signal to the first substrate 630 through the fourth substrate 650. In this case, the longer the length of a signal line that transmits the image signal, the more it may affect the quality of the image signal, and accordingly, the fifth terminal portion 642-2 and the sixth terminal portion 642-3 may be aligned with each other in the optical axis direction in order to minimize the length of the signal line. And, one of the fifth terminal portion 642-2 and the sixth terminal portion 642-3 is a terminal for transmitting an image signal, the other is a terminal for transmitting signals other than the image signal. Accordingly, the fifth terminal portion 642-2 and the sixth terminal portion 642-3 in the embodiment are separated from each other with an opening therebetween, and thereby, the effect of noise generated in the process of transmitting the image signal is minimized.

Meanwhile, the third substrate 642 may include a plurality of coupling protrusions 642-1 protruding outward from an outer surface. In addition, the coupling protrusion 642-1 may include a third through-hole 642-4 penetrating in the optical axis direction.

The third through-hole 642-4 may be aligned with the first through hole 621-4 formed in the holder 621 and the second through-hole 641-6 formed in the second substrate 641 in the optical axis direction. In addition, a portion of the connection wire 624 passing through the first through hole 621-4 and the second through hole 641-6 may be disposed in the third through hole 642-4.

In this case, a coupling pad (not shown) may be disposed around the third through hole 642-4 on the lower surface of the coupling protrusion 642-1. The coupling pad (not shown) may be disposed around the third through hole 642-4 for soldering the connection wire 624. In addition, the other end of the connection wire 624 may be soldered to the coupling pad after passing through the third through hole 642-4.

Consequently, one end of the connection wire 624 is coupled to the damping plate 622, and the other end of the connection wire 624 is coupled to the third substrate 642. In addition, a portion between one end and the other end of the connection wire 624 may be located in the first through hole 621-4, the second through hole 641-6, and the third through hole 642-4. In this case, the length of the connection wire 624 may be greater than the sum of the thickness of the damping plate 622, the thickness of the holder 621, the thickness of the second substrate 641, and the thickness of the third substrate 642. Accordingly, the coil moving substrate portion 640 may be disposed in a state of being suspended from the holder portion 620 at a position spaced apart from the holder portion 620 by a predetermined distance through the connection wire 624.

—Fourth Substrate—

The fourth substrate 650 may be disposed between the first substrate 630 and the third substrate 642. At least a portion of the fourth substrate 650 may have elasticity. In addition, the coil moving substrate portion 640 disposed on the fourth substrate 650 may move relative to the lens portion by the elastic force of the fourth substrate 650 and the interaction between the magnet portion 623 and the coil portion 641-2.

The fourth substrate 650 and the elastic force that the fourth substrate 650 may have will be described in detail.

The fourth substrate 650 enables the shift of the image sensor module 400 and also enables signal transmission. Accordingly, the fourth substrate 650 may be referred to as an elastic member disposed between the fixed portion and the moving portion to move while elastically supporting the moving portion.

The fourth substrate 650 may include an inner frame, an outer frame spaced apart from the inner frame, and an elastic pattern portion between the inner frame and the outer frame. This will be described below.

The fourth substrate 650 includes an insulating layer 651 and a pattern portion 652 disposed on one surface of the insulating layer 651. At this time, although the drawing shows that the pattern portion 652 is disposed on a lower surface of the insulating layer 651, the embodiment is not limited thereto, and the pattern portion 652 may be disposed on an upper surface of the insulating layer 651.

The insulating layer 651 may be divided into a plurality of regions separated from each other.

For example, the insulating layer 651 may include a first insulating portion 651-1 in which an opening is formed in a center and a second insulating portion 651-2 disposed outside the first insulating portion 651-1 and spaced apart from the first insulating portion 651-1. In this case, although it is illustrated that the first insulating portion 651-1 and the second insulating portion 651-2 are separated from each other in the drawings, the embodiment is not limited thereto. A connection insulating portion (not shown) connecting an outer side of the first insulating portion 651-1 and an inner side of the second insulating portion 651-2 may be further disposed between the first insulating portion 651-1 and the second insulating portion 651-2. In other words, the insulating layer 651 may have a structure in which the first insulating portion 651-1 and the second insulating portion 651-2 are physically completely separated with an open region interposed therebetween, alternatively may be connected to each other in some regions through a connection insulating portion additionally disposed in the open region. This allows a part of the insulating portion to remain without completely removing the region between the first insulating portion 651-1 and the second insulating portion 651-2, and the remaining insulating portion may function as a connection insulating portion connecting between the first insulating portion 651-1 and the second insulating portion 651-2. The connection insulating portion may provide an elastic force in the shift operation of the image sensor module 400, and furthermore, it is possible to prevent detachment between the first insulating portion 651-1 and the second insulating portion 651-2 during the shifting operating. The insulating layer 651 may be formed by removing a region corresponding to the open region on one insulating member through etching or physical punching.

However, it is important here that in the insulating layer 651 in the embodiment, an open region is formed between the first insulating portion 651-1 and the second insulating portion 651-2, and the first insulating portion 651-1 and the second insulating portion 651-2 may be separated from each other without being connected to each other in the open region.

The second insulating portion 651-2 may be disposed to surround the periphery of the first insulating portion 651-1 at a position spaced apart from the first insulating portion 651-1 by a predetermined distance through the open region. In this case, the first insulating portion 651-1 and the second insulating portion 651-2 may form a single layer structure disposed on the same plane.

The insulating layer 651 may have a thickness of 20 μm to 100 μm. For example, the insulating layer 651 may have a thickness of 25 μm to 50 μm. For example, the insulating layer 651 may have a thickness of 30 μm to 40 μm. When the thickness of the insulating layer 651 is greater than 100 μm, the overall thickness of the fourth substrate 650 may increase. When the thickness of the insulating layer 651 is less than 20 μm, the pattern portion 652 may not be stably supported. For example, when the thickness of the insulating layer 651 is less than 20 μm, it may be vulnerable to heat/pressure, etc. in the soldering process for bonding with the first substrate 630 or the third substrate 642, and accordingly, the bonding force with the first substrate 630 or the third substrate 642 may be reduced.

Meanwhile, although not shown in the drawings, at least one slit (not shown) may be formed on the first insulating portion 651-1. The slit may be formed to maintain the flatness of the first insulating portion 651-1. The slit reduces the weight of the insulating layer 651 and furthermore the fourth substrate 650 while maintaining flatness, thereby improving the overall reliability of the camera module.

A pattern portion 652 is disposed on one surface of the insulating layer 651.

The pattern portion 652 includes a first pattern portion 652a having a signal transmission function and a second pattern portion 652b separated from the first pattern portion 652a and for securing rigidity. The second pattern portion 652b may be referred to as a reinforcing pattern or a support plate for securing rigidity of the fourth substrate 650. Meanwhile, although not shown in the drawing, an adhesive sheet (not shown) may be disposed between the insulating layer 651 and the pattern portion 652, and accordingly, the adhesive force between the insulating layer 651 and the pattern portion 652 may be improved.

The first pattern portion 652a includes a first lead pattern portion 652-1 disposed on the first insulating portion 651-1 of the insulating layer 651, a second lead pattern portion 652-2 disposed on the second insulating portion 651-2 of the insulating layer 651, and a connection pattern portion 652-3 disposed on the open region between the first insulating portion 651-1 and the second insulating portion 651-2 and electrically connecting between the first lead pattern portion 652-1 and the second lead pattern portion 652-2. In this case, the connection pattern portion 652-3 is disposed on the open region between the first insulating portion 651-1 and the second insulating portion 651-2.

In addition, the connection pattern portion 652-3 may be referred to as an elastic connection portion elastically connecting the first insulating portion 651-1 and the second insulating portion 651-2 of the insulating layer 651 to be described below. This will be described in detail below.

The first insulating portion 651-1 of the insulating layer 651 and the first lead pattern portion 652-1 of the first pattern portion 652a may form an inner frame of the fourth substrate 650. In addition, the inner frame of the fourth substrate 650 may further include a first reinforcing pattern 652-4 of a second pattern portion 652b to be described later.

In addition, the second insulating portion 651-2 of the insulating layer 651 and the second lead pattern portion 652-2 of the first pattern portion 652a may form an outer frame of the fourth substrate 650. In addition, the outer frame of the fourth substrate 650 may further include a second reinforcing pattern 652-5 of the second pattern portion 652b to be described later.

In addition, the connection pattern portion 652-3 may form an elastic connection portion elastically connecting the outer frame and the inner frame of the fourth substrate 650. The connection pattern portion 652-3 may form a signal transmission path between the inner frame and the outer frame of the fourth substrate 650. In addition, the connection portion of the fourth substrate 650 may include a third reinforcing pattern 652-6 of the second pattern portion 652b as well as the connection pattern portion 652-3.

The first lead pattern portion 652-1 may be respectively disposed on two side regions facing each other among the four side regions of the first insulating portion 651-1. That is, the first insulating portion 651-1 may include a left side region, a right side region, an upper side region, and a lower side region. In addition, the first lead pattern portion 652-1 may be disposed in the upper side region and the lower side region facing each other among the four side regions of the first insulating portion 651-1, respectively. In addition, the first lead pattern portion 652-1 may not be disposed in the left side region and the right side region of the side regions of the first insulating portion 651-1.

The second lead pattern portion 652-2 may be disposed in side regions different from the side regions in which the first lead pattern portion 652-1 is disposed among the four side regions of the second insulating portion 651-2.

That is, the second insulating portion 651-2 may include a left side region, a right side region, an upper side region, and a lower side region. In addition, the second lead pattern portion 652-2 may be respectively disposed on the left side region and the right side region facing each other among the four side regions of the second insulating portion 651-2. Also, the second lead pattern portion 652-2 may not be disposed in the upper and lower side regions of the side regions of the second insulating portion 651-2.

As described above, the first lead pattern portion 652-1 and the second lead pattern portion 652-2 may be disposed in different side regions of each of the first insulating portion 651-1 and the second insulating portion 651-2. That is, the first lead pattern portion 652-1 is disposed in the upper side region and the lower side region of the first insulating portion 651-1. Also, differently from this, the second lead pattern portion 652-2 is disposed on the left side region and the right side region of the second insulating portion 651-2. Accordingly, the first lead pattern portion 652-1 and the second lead pattern portion 652-2 may be disposed so as not to face each other in the open region between the first insulating portion 651-1 and the second insulating portion 651-2. This may improve the reliability of a Z-roll operation of the image sensor module 400.

Here, the first lead pattern portion 652-1 may be an inner lead pattern portion connected to the sixth terminal portion 642-3 of the third substrate 642. In addition, the second lead pattern portion 652-2 may be an outer lead pattern portion connected to the first terminal portion 635 of the first substrate 630.

The first lead pattern portion 652-1 and the second lead pattern portion 652-2 may be connected to each other through a connection pattern portion 652-3. The connection pattern portion 652-3 may have one end connected to the first lead pattern portion 652-1 and the other end connected to the second lead pattern portion 652-2, and a region excluding the one end and the other end of the connection pattern portion may be positioned on the open region between the first insulating portion 651-1 and the second insulating portion 651-2. That is, the connection pattern portion 652-3 may be disposed in a flying state on the open region between the first insulating portion 651-1 and the second insulating portion 651-2. Here, the flying state means that the insulating layer 651 does not exist on at least a portion of the connection pattern portion 652-3, and accordingly, it may mean a state in which at least a portion of the connection pattern portion 652-3 is floating in the air.

In this case, the first lead pattern portion 652-1 is configured in plurality. Also, the second lead pattern portion 652-2 is configured in plurality. In addition, the connection pattern portion 652-3 may connect the plurality of first lead pattern portions 652-1 and the plurality of second lead pattern portions 652-2 in a 1:1 ratio.

In this case, the first lead pattern portion 652-1 may include 36 first lead patterns. Also, the second lead pattern portion 652-2 may include 36 second lead patterns. Accordingly, the connection pattern portion 652-3 also includes 36 connection patterns, and thus the first lead patterns and the second lead patterns may be connected.

The connection pattern portion 652-3 may be bent and disposed at least once on the open region. That is, the connection pattern portion 652-3 may include at least one bent portion. The connection pattern portion 652-3 may be disposed to have a rotational structure on the open region.

For example, when the first lead pattern portion 652-1 and the second lead pattern portion 652-2 are disposed to face each other on the insulating layer 651, the connection pattern portion 652-3 may connect a straight line between the first lead pattern portion 652-1 and the second lead pattern portion 652-2 without the bent portion.

Unlike this, since the first lead pattern portion 652-1 and the second lead pattern portion 652-2 are not disposed to face each other in the embodiment, the connection pattern portion 652-3 includes the bent portion that is bent at least once. In addition, the bent portion of the connection pattern portion 652-3 may improve the elasticity of the connection pattern portion 652-3 and improve the rigidity of the connection pattern portion 652-3.

In this case, a length of the connection pattern portion 652-3 is greater than a width of the open region between the first insulating portion 651-1 and the second insulating portion 651-2.

The connection pattern portion 652-3 may be formed by etching to have the shape as described above through methods an additive process, a subtractive process, a Modified Semi Additive Process (MSAP), and a Semi Additive Process (SAP). Preferably, the first lead pattern portion 652-1, the second lead pattern portion 652-2, and the connection pattern portion 652-3 are integrally formed with each other, and accordingly, it may be simultaneously formed by etching one metal layer.

Meanwhile, a thickness of the first pattern portion 652 including the first lead pattern portion 652-1, the second lead pattern portion 652-2, and the connection pattern portion 652-3 may be 10 μm to 50 μm. For example, the thickness of the first pattern portion 652 may be 30 μm to 40 μm. In this case, when the thickness of the first pattern portion 652 is less than 10 μm, the first pattern portion 652 may be broken during the shifting of the image sensor module 400. In addition, when the thickness of the first pattern portion 652 is greater than 50 μm, the elastic force of the connection pattern portion 652-3 may be decreased, and accordingly, the mobility of the image sensor module 400 may be hindered. Accordingly, the thickness of the first pattern portion 652 is 35 μm±5 μm, so that the image sensor module 400 can be stably shifted in the embodiment.

In addition, the length of the connection pattern portion 652-3 is greater than the width of the open region between the first insulating portion 651-1 and the second insulating portion 651-2. Here, the width of the open region may be a linear distance connecting the first insulating portion 651-1 and the second insulating portion 651-2 in a straight line.

In addition, the length of the connection pattern portion 652-3 is at least 1.5 times the linear distance. In addition, the length of the connection pattern portion 652-3 is set to be 20 times or less of the linear distance.

At this time, when the length of the connection pattern portion 652-3 is less than 1.5 times the linear distance, the shift operation of the image sensor module 400 may be affected due to the decrease in the elastic force of the connection pattern portion 652-3. In addition, when the length of the connection pattern portion 652-3 is greater than 20 times the linear distance, the resistance increases as the signal transmission distance increases corresponding to the length of the connection pattern portion 652-3, and accordingly, noise may be included in the signal transmitted through the connection pattern portion 652-3.

On the other hand, the first pattern portion 652 as described above is a wiring that transmits an electrical signal, and may be formed of a metal material having high electrical conductivity. To this end, the first pattern portion 652 may be formed of at least metal material selected from gold (Au), silver (Ag), platinum (Pt), titanium (Ti), tin (Sn), copper (Cu), and zinc (Zn). In addition, the first pattern portion 652 may be formed of a paste or solder paste including at least one metal material selected from gold (Au), silver (Ag), platinum (Pt), titanium (Ti), tin (Sn), copper (Cu), and zinc (Zn) having excellent bonding strength.

Preferably, the first pattern portion 652 may be formed of a metallic material having an elastic force that enables shifting in the X-axis, Y-axis, and Z-axis directions of the image sensor module 400 disposed on the coil moving substrate portion 640 on the fourth substrate 650 while serving as a wiring for transmitting an electrical signal. To this end, the first pattern portion 652 may be formed of a metal material having a tensile strength of 1000 MPa or more. For example, the first pattern portion 652 may be a binary alloy or a ternary alloy including copper. For example, the first pattern portion 652 may be a binary alloy of copper (Cu)-nickel (Ni). For example, the first pattern portion 652 may be a binary alloy of copper (Cu)-tin (Sn). For example, the first pattern portion 652 may be a binary alloy of copper (Cu)-beryllium (Be). For example, the first pattern portion 652 may be a binary alloy of copper (Cu)-cobalt (Co). For example, the first pattern portion 652 may be a ternary alloy of copper (Cu)-nickel (Ni)-tin (Sn). For example, the first pattern portion 652 may be a ternary alloy of copper (Cu)-beryllium (Be)-cobalt (Co). In addition to the metal material, the first pattern portion 652 may be formed of an alloy such as iron (Fe), nickel (Ni), zinc, etc., which has good electrical properties while having an elastic force that can act as a spring. Also, the first pattern portion 652 may be surface-treated with a plating layer including a metal material such as gold (Au), silver (Ag), palladium (Pd), and the like, thereby improving electrical conductivity.

The second pattern portion 652b may be selectively disposed on one surface of the insulating layer 651 in a region where the first pattern portion 652 is not disposed.

The second pattern portion 652b may include a first reinforcing pattern 652-4 disposed on the first insulating portion 651-1, a second reinforcing pattern 652-5 disposed on the second insulating portion 651-2, and a third reinforcing pattern 652-6 disposed on the open region and connecting the first reinforcing pattern 652-4 and the second reinforcing pattern 652-5.

The first reinforcing pattern 652-4 may be disposed on a left side region and a right side region of the first insulating portion 651-1.

In addition, the second reinforcing pattern 652-5 may be disposed on one surface of the second insulating portion 651-2 in a region where the second lead pattern portion 652-2 is not disposed.

In addition, the second reinforcing pattern 652-5 includes a first part disposed on the upper surface of the second insulating portion 651-2, and a second part extending from the first part and disposed outside the second insulating portion. The second part of the second reinforcing pattern portion 652b may be disposed to extend outside the second insulating portion 651-2 in order to maintain the flatness of the second substrate 641 while securing the rigidity of the second substrate 641. In addition, at least one coupling hole 652-7 may be formed in the second part of the second reinforcing pattern 652-5. Accordingly, although not shown in the drawing, a coupling protrusion (not shown) corresponding to the coupling hole 652-7 may be disposed on the first substrate 630, and accordingly, the bonding force between the fourth substrate 650 and the first substrate 630 may be improved.

Meanwhile, the second pattern portion 652b may be formed of the same metal material as that of the first pattern portion 652. Preferably, the second pattern portion 652b may be formed together with the first pattern portion 652 in the same process.

Meanwhile, the first insulating portion 651-1, the first lead pattern portion 652-1, and the first reinforcing pattern 652-4 of the fourth substrate 650 may be a moving portion that moves together with the coil moving substrate portion 640.

In addition, the second insulating portion 651-2, the second lead pattern portion 652-2 and the second reinforcing pattern 652-5 of the fourth substrate 650 may be a fixed portion fixed on the first substrate 630.

In addition, the connection pattern portion 652-3 of the fourth substrate 650 may be a metal pattern having an elastic force that enables the shift of the image sensor module 400 while transmitting a signal.

In addition, the third reinforcing pattern 652-6 of the fourth substrate 650 may have an elastic force that enables the shift of the image sensor module 400 together with the connection pattern portion 652-3.

Meanwhile, a line width of the first lead pattern portion 652-1 may be the same as a line width of the second lead pattern portion 652-2.

In addition, a line width of the connection pattern portion 652-3 may be smaller than the line width of the first lead pattern portion 652-1 and the second lead pattern portion 652-2.

At this time, a buffer portion gradually decreases in width, has a rounded side surface rather than a straight line, and may be formed between the first lead pattern portion 652-1 and the connection pattern portion 652-3 and between the second lead pattern portion 652-2 and the connection pattern portion 652-3.

That is, side surfaces of both ends of the connection pattern portion 652-3 may have a curvature. At this time, when the side surfaces of both ends of the connection pattern portion 652-3 have a straight shape, stress may be concentrated in the side surface of the connection pattern portion, and accordingly, a disconnection phenomenon in which the connection pattern portion 652-3 is separated from the first lead pattern portion 652-1 or the second lead pattern portion 652-2 may occur.

Accordingly, the end of the connection pattern portion 652-3 has a rounded side surface to prevent stress from being concentrated at the end.

At this time, a value of the curvature R of the side surface of the end of the connection pattern portion 652-3 is set to have a value between 30 and 100. When the value of the curvature (R) of the side surface is less than 30, the stress concentration prevention effect is insignificant, and when it is greater than 100, the elastic force of the connection pattern portion 652-3 may be reduced.

Here, the line width of the connection pattern portion 652-3 may have a line width of 20 to 1000 μm. When the line width of the connection pattern portion 652-3 is less than 20 μm, the overall rigidity of the connection pattern portion 652-3 may decrease, thereby reducing reliability. In addition, when the line width of the connection pattern portion 652-3 is greater than 1000 μm, the elastic force of the connection pattern portion 652-3 is reduced, and thus a problem may occur in shifting of the image sensor module 400.

Meanwhile, the first lead pattern portion 652-1 may include a first-first lead pattern part 652-1*a* disposed on the first insulating portion 651-1 of the insulating layer 651, and a first-second lead pattern part 652-1*b* extending from the first-first lead pattern part 652-1*a* and protruding inward of the first insulating portion 651-1. The first-second lead pattern part 652-1*b* is disposed to protrude from the first insulating portion 651-1, and accordingly, it is possible to provide the ease of a soldering process performed for coupling with the sixth terminal portion 642-3 of the third substrate 642.

The second lead pattern portion 652-2 may include a second-first lead pattern part 652-2*a* disposed on the second insulation portion 651-2 of the insulation layer 651, and a second-second lead pattern part 652-2*b* extending from the second-first lead pattern part 652-2*a* and protruding outward of the first insulating portion 651-2. The second-second lead pattern part 652-2*b* is disposed to protrude outward from the second insulating portion 651-2, and accordingly, it is possible to provide the ease of a soldering process performed for coupling with the first terminal portion 635 of the first substrate 630.

Meanwhile, the insulating layer 651 may include a third insulating portion 651-3 disposed on the open region between the first insulating portion 651-1 and the second insulating portion 651-2.

The third insulating portion 651-3 may be disposed on the connection pattern portion 652-3. The third insulating portion 651-3 may serve to increase the rigidity of the connection pattern portion 652-3.

In addition, a shape of the connection pattern portion 652-3 is changed during the operation of the image sensor module 400, and accordingly, different connection pattern portions may be in contact with each other. Accordingly, the third insulating portion 651-3 may be disposed on the connection pattern portion 652-3 to maintain a gap between the connection pattern portions 652-3. That is, the third insulating portion 651-3 may be formed to solve a short circuit problem that may occur as the plurality of connection pattern portions 652-3 come into contact with each other during the shift operating of the image sensor module 400.

To this end, the third insulating portion 651-3 may be commonly disposed on a plurality of different connection pattern portions 652-3. Preferably, the third insulating portion 651-3 may be disposed on the bent portion of the plurality of different connection pattern portions 652-3. That is, the bent portion of the connection pattern portion 652-3 may have lower rigidity, and accordingly, the third insulating portion 651-3 may improve the rigidity of the bent portion while solving the short circuit problem.

<Image Sensor Module>

Figure 22:
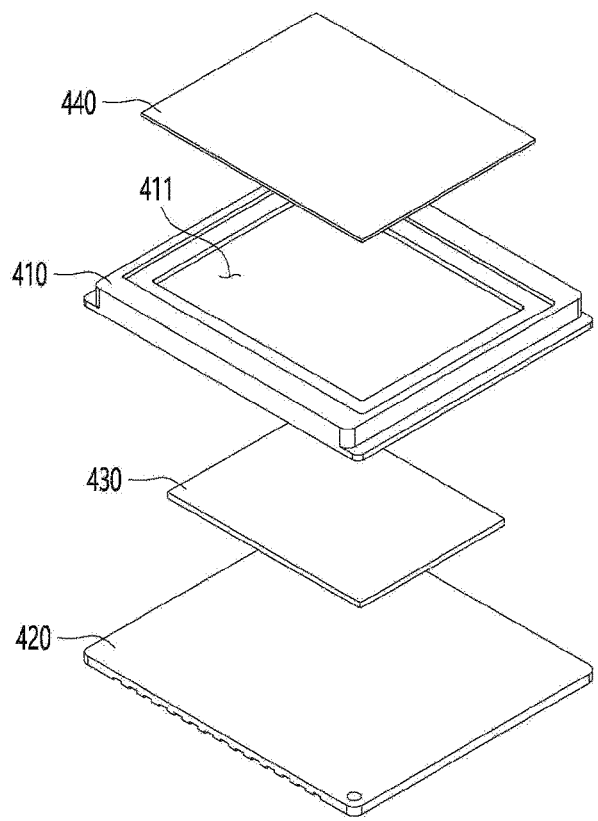
FIG. 22 is an exploded perspective view of an image sensor module according to an embodiment.
Figure 23:
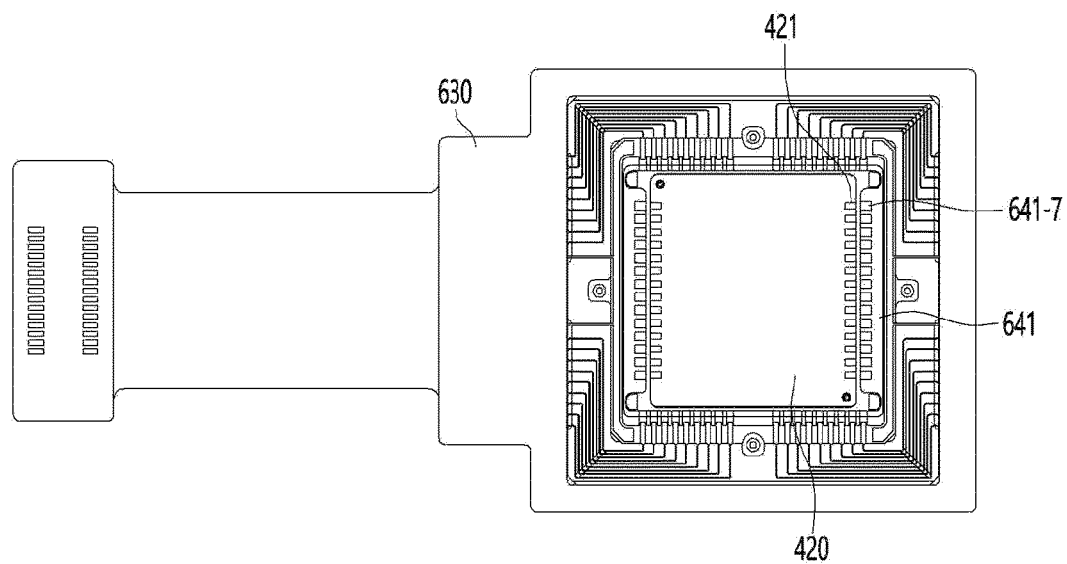
FIG. 23 is a view illustrating a coupling between a second substrate and an image sensor module.

FIG. 22 is an exploded perspective view of an image sensor module according to an embodiment, and FIG. 23 is a view illustrating a coupling between a second substrate and an image sensor module.

Referring to FIGS. 22 and 23, the image sensor module 400 may include a filter 440, the adhesive member 440, a sensor base 410, the image sensor 430, and an image sensor substrate 420.

The image sensor module 400 includes the sensor base 410.

The sensor base 410 may include an opening 411, and a stepped protrusion may be provided to allow the filter 440 to be seated adjacent to the opening 411. In addition, the adhesive member may be disposed on the stepped protrusion, and the filter 440 may be fixedly disposed on the adhesive member. Such a filter 440 may serve to block light of a specific frequency band of light passing through the lens module 100 from being incident on the image sensor 430. The filter 440 may be disposed to be parallel to an x-y plane. The filter 440 may be disposed between the lens module 100 and the image sensor 430. The filter 440 may include an infrared filter. The infrared filter may absorb or reflect infrared light incident on the infrared filter.

The image sensor substrate 420 may be a package substrate. That is, the image sensor 430 may be mounted in a package form on the image sensor substrate 420. The image sensor substrate 420 may include a printed circuit board (PCB). The image sensor substrate 420 may include a circuit substrate. The image sensor 430 may be disposed on the image sensor substrate 420. The image sensor substrate 420 may be coupled to the second substrate 641. To this end, a seventh terminal portion 421 electrically connected to the fourth terminal portion 641-7 of the second substrate 641 may be provided on a lower surface of the image sensor substrate 420. In this case, as described above, the seventh terminal portion 421 is also disposed at edge regions opposite to each other on the lower surface of the image sensor substrate 420, and accordingly, positions of the pads to which the image signal is transmitted can be separated from the other pads. Meanwhile, the image sensor substrate 420 may be positioned within the opening of the second substrate 641, and the seventh terminal portion 421 may be arranged in the opening of the second substrate 641 in a horizontal direction with the fourth terminal portion 641-7 of the second substrate 641. In addition, the fourth terminal portion 641-7 and the seventh terminal portion 421 may be coupled to each other through soldering or the like. At this time, the adhesive member by soldering is omitted in the drawing, the seventh terminal portion 421 and the fourth terminal portion 641-7 may be spaced apart before the soldering process, and the seventh terminal portion 421 and the fourth terminal portion 641-7 may be electrically connected to each other through a soldering process.

The image sensor 430 may have a configuration in which light passing through the lens module 100 and the filter 440 is incident to form an image. The image sensor 430 may be mounted on the image sensor substrate 420. The image sensor 430 may be electrically connected to the image sensor substrate 420. For example, the image sensor 430 may be coupled to the image sensor substrate 420 by surface mounting technology (SMT). As another example, the image sensor 430 may be coupled to the image sensor substrate 420 by flip chip technology. The image sensor 430 may be disposed to coincide with the lens module 100 in an optical axis. That is, the optical axis of the image sensor 430 and the optical axis of the lens module 100 may be aligned. The image sensor 430 may convert light irradiated to the effective image region of the image sensor 430 into an electrical signal. In addition, the converted electrical signal may be an image signal. The image sensor 430 may be any one of a charge coupled device (CCD), a metal oxide semi-conductor (MOS), a CPD, and a CID.

<Image Sensor Module Shift Driving Operation>

Hereinafter, a shift operation of the image sensor module 400 will be described.

Figure 24A:
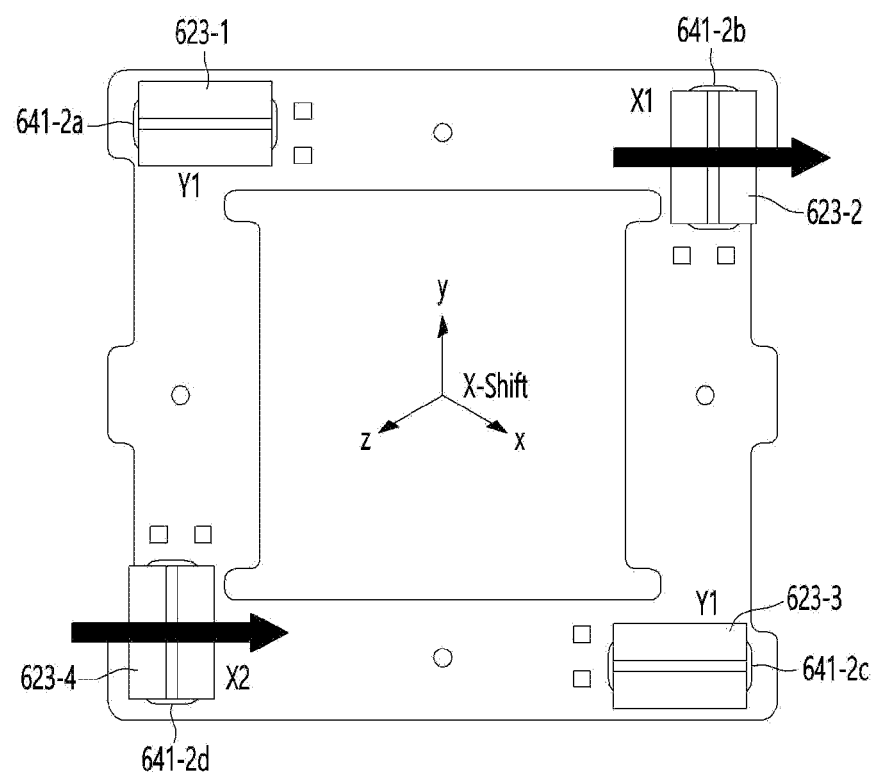
FIG. 24a is a view for explaining x-axis direction shift driving through some configurations of the camera device according to the present embodiment.
Figure 24B:
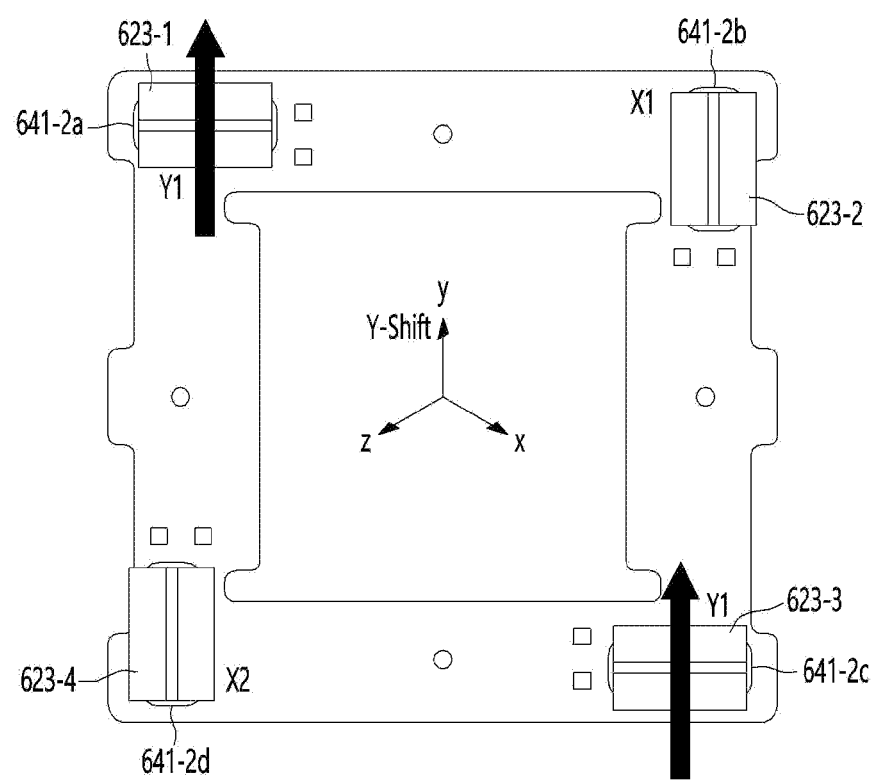
FIG. 24b is a view for explaining y-axis direction shift driving through some configurations of the camera device according to the present embodiment.
Figure 24C:
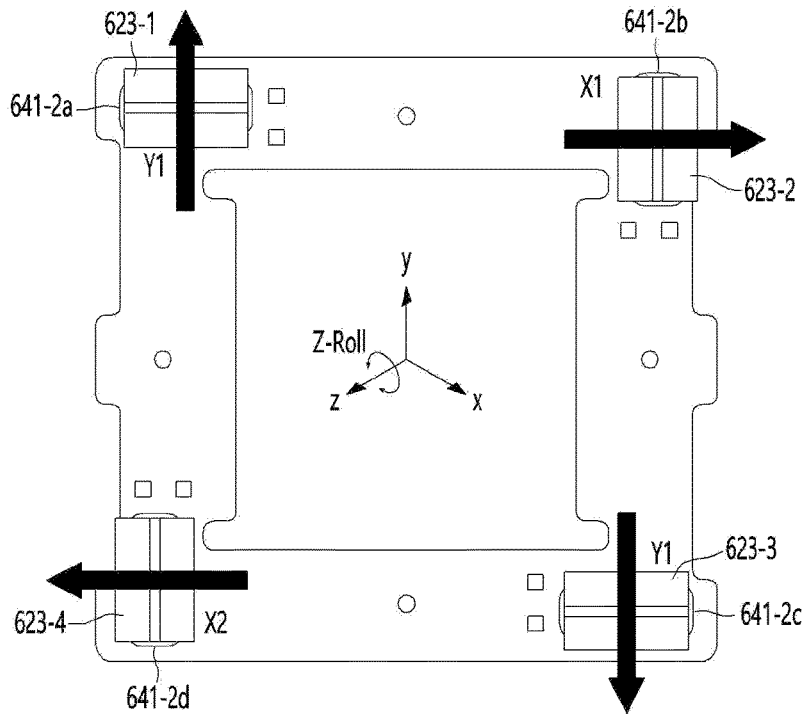
FIG. 24c is a view for explaining z-axis rotational driving through some configurations of the camera device according to the present embodiment.

FIG. 24*a* is a view for explaining x-axis direction shift driving through some configurations of the camera device according to the present embodiment, FIG. 24*b* is a view for explaining y-axis direction shift driving through some configurations of the camera device according to the present embodiment, and FIG. 23c is a view for explaining z-axis rotational driving through some configurations of the camera device according to the present embodiment.

As shown in FIG. 24a, when currents in the same direction are applied to the second coil 641-2b and the fourth coil 623-2d in the present embodiment, the image sensor 430 coupled to the image sensor module 400 may be moved (shifted) in the x-axis direction by electromagnetic interaction between the second magnet 623-2 and the fourth magnet 623-4, respectively. That is, the second coil 641-2b, the second magnet 623-2, and the fourth coil 623-2d and the fourth magnet 623-4 may be used for the x-axis direction shift drive of the image sensor 430. In this case, the second coil 641-2b and the second magnet 623-2 may be a first x-axis shift driver X1, and the fourth coil 623-2d and the fourth magnet 623-4 may be a second x-axis shift driver X2.

As shown in FIG. 24b, when currents in the same direction are applied to the first coil 641-2a and the third coil 641-2c the present embodiment, the image sensor 430 coupled to the image sensor module 400 may be moved (shifted) in the y-axis direction by electromagnetic interaction between the first magnet 623-1 and the third magnet 623-3, respectively. That is, the first coil 641-2a, the first magnet 623-1, the third coil 641-2c, and the third magnet 623-3 may be used for the y-axis direction shift drive of the image sensor 430. In this case, the first coil 641-2a and the first magnet 623-1 may be a first y-axis shift driver Y1, and the third coil 641-2c and the third magnet 623-3 may be a second y-axis shift driver Y2.

As shown in FIG. 24d, currents in opposite directions are applied to the first coil 641-2a and the third coil 623-2c and currents in opposite directions are applied to the second coil 641-2b and the fourth coil 641-2d in the present embodiment, and at this time, when a direction in which the coil portion 641-2 is rotated by the current applied to the second coil 641-2b and the current applied to the first coil 641-2a is the same, the image sensor 430 coupled to the image sensor module 400 may be rotated (rolled) around the z-axis. An embodiment shown in FIG. 24d illustrates a case in which the coil portion 641-2 is controlled by four channels, and when the coil portion 641-2 is controlled by three channels, the image sensor 430 may be rolled by the first coil 641-2a and the third coil 623-2c or the second coil 641-2b and the fourth coil 641-2d. This is because when there is a coil combined into one channel among the first coil 641-2a and the third coil 623-2c, and the second coil 641-2b and the fourth coil 641-2d, the current may not be applied in the opposite direction.

In the present embodiment, a magnetic flow of the magnet portion 623 may be confirmed that lines of magnetic force passing perpendicular to the coil portion 641-2 exists, and when a current is applied to the coil portion 641-2 in this state, the coil portion 641-2 may move with respect to the magnet portion 623 by the Lorentz force.

<Shift Reliability Evaluation>

In the embodiment, the coil moving substrate portion 640 is connected to the first lead pattern portion 652-1 disposed on the first insulating portion 651-1 of the fourth substrate 650, the image sensor module 400 is coupled to the coil moving substrate portion 640, and these are shifted by the elastic force provided through the connection pattern portion 652-3 of the fourth substrate 650.

In this case, the connection pattern portion 652-3 is arranged in a direction horizontal to the optical axis direction to enable the shift of the image sensor module 400.

Here, when the shift operation of the image sensor module 400 is performed only with the connection pattern portion 652-3, the connection pattern portion 652-3 may be tilted in the optical axis direction when the image sensor module 400 is shifted.

That is, it was confirmed that the image sensor module 400 is tilted in the optical axis direction during the operation of shifting the image sensor module 400 in the x-axis direction. That is, it was confirmed that one side of the coil moving substrate 640 on which the image sensor module 400 is disposed has a first tilt phenomenon that moves in an upward direction, and the other side of the coil moving substrate 640 has a second tilt phenomenon that moves in a downward direction. In addition, the first and second tilt phenomena as described above may affect the reliability of the shift operation of the image sensor module 400.

On the other hand, the embodiment includes a connection wire having one end connected to the damping plate included in the holder portion and the other end connected to the coil moving substrate portion 640. In addition, the connection wire is disposed in the optical axis direction in the camera device. Accordingly, the connection wire is prevented from being tilted upward or downward during the shift operation of the coil moving substrate portion 640. That is, the connection wire supports the coil moving substrate portion 640, and accordingly, a sagging phenomenon of the coil moving substrate portion 640 occurring during the shift operation is prevented.

<Optical Device>

Figure 25:
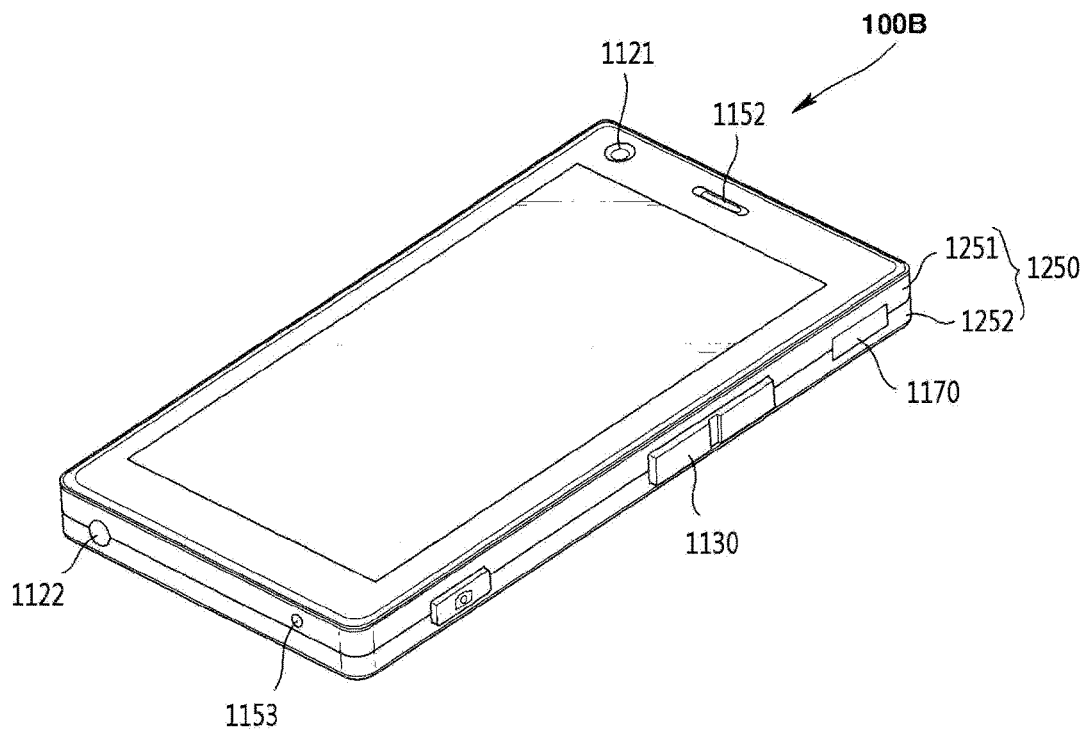
FIG. 25 is a perspective view of an optical device according to the present embodiment.
Figure 26:
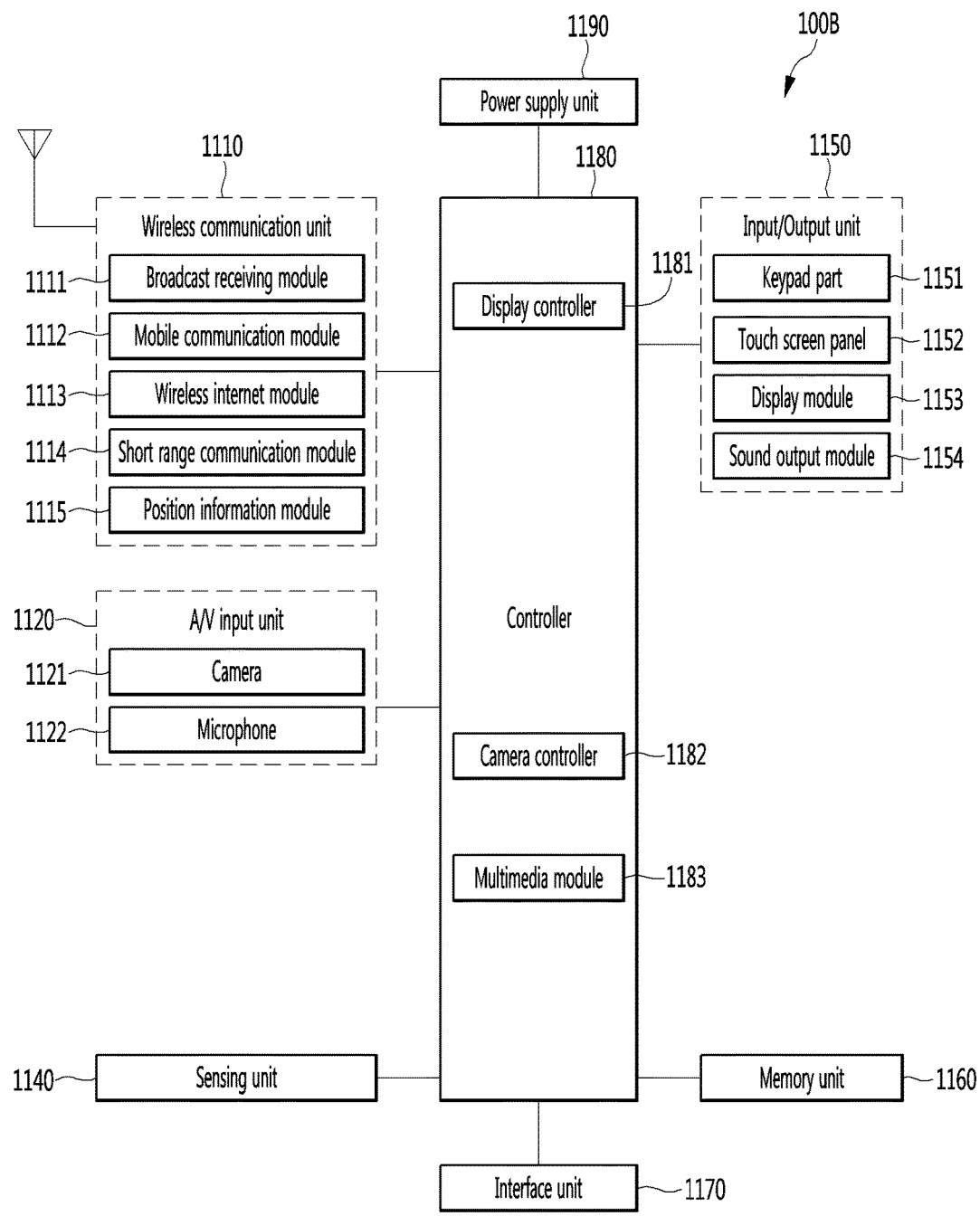
FIG. 26 is a block diagram of the optical device shown in FIG. 25.

FIG. 25 is a perspective view of an optical device according to the present embodiment, and FIG. 26 is a block diagram of the optical device shown in FIG. 26.

The optical device may be any one of a mobile phone and a portable phone, a smart phone, a portable smart device, a digital camera, a laptop computer, a digital broadcasting terminal, a personal digital assistant (PDA), a portable multimedia player (PMP), and a navigation device. However, types of the optical device are not limited thereto, and any device for capturing an image or a picture may be included in the optical device.

The optical device may include a main body 1250. The main body 1250 may be in the form of a bar. Alternatively, the main body 1250 may have various structures such as a slide type, a folder type, a swing type, a swivel type, and the like in which two or more sub-bodies are coupled to be relatively movable. The main body 1250 may include a case (casing, housing, and cover) forming an external appearance. For example, the main body 1250 may include a front case 1251 and a rear case 1252. Various electronic components of the optical device may be built in a space formed between the front case 1251 and the rear case 1252. A display 2151 may be disposed on one surface of the main body 1250. A camera 1121 may be disposed on any one or more surfaces of one surface of the main body 1250 and the other surface disposed on the opposite side of the one surface.

The optical device may include a wireless communication unit 1110. The wireless communication unit 1110 may include one or more modules that enable wireless communication between the optical device and a wireless communication system or between the optical device and a network in which the optical device is positioned. For example, the wireless communication unit 1110 may include any one or more of a broadcast receiving module 1111, a mobile communication module 1112, a wireless internet module 1113, a short range communication module 1114, and a position information module 1115.

The optical device may include an NV input unit 1120. The NV input unit 1120 is for inputting an audio signal or a video signal and may include any one or more of a camera 1121 and a microphone 1122. In this case, the camera 1121 may include a camera device according to the first or embodiment described above.

The optical device may include a sensing unit 1140. The sensing unit 1140 may sense a current state of the optical device such as an opening/closing state of the optical device, a position of the optical device, a presence of a user contact, orientation of the optical device, acceleration/deceleration of the optical device, and the like to generate a sensing signal for controlling an operation of the optical device. For example, when the optical device is in the form of a slide phone, whether the slide phone is opened or closed may be sensed. In addition, it may be responsible for sensing functions related to whether a power supply unit 1190 supplies power or whether an interface unit 1170 is coupled to an external device.

The optical device may include an input/output unit 1150. The input/output unit 1150 may be a configuration for generating an input or output related to vision, hearing, or tactile sense. The input/output unit 1150 may generate input data for controlling an operation of the optical device, and may output information processed by the optical device.

The input/output unit 1150 may include at least one of a keypad portion 1130, a display 1151, a sound output module 1152, and a touch screen panel 1153. The keypad portion 1130 may generate input data by using a keypad input. The display 1151 may output an image captured by the camera 1121. The display 1151 may include a plurality of pixels whose color changes according to an electrical signal. For example, the display 1151 may include at least one of a liquid crystal display (LCD), a thin film transistor-liquid crystal display (TFT LCD), an organic light-emitting diode (OLED), a flexible display, and a three-dimensional (3D) display. The sound output module 1152 may output audio data received from the wireless communication unit 1110 in a call signal reception, a call mode, a recording mode, a voice recognition mode, or a broadcast reception mode, or output audio data stored in a memory unit 1160. The touch screen panel 1153 may convert a change in capacitance generated due to a user's touch on a specific region of a touch screen into an electrical input signal.

The optical device may include the memory unit 1160. The memory unit 1160 may store a program for processing and controlling a controller 1180. In addition, the memory unit 1160 may store input/output data, for example, any one or more of a phone book, a message, audio, a still image, a photo, and a video. The memory unit 1160 may store an image captured by the camera 1121, for example, a picture or a video.

The optical device may include the interface unit 1170. The interface unit 1170 serves as a path for connecting with an external device connected to the optical device. The interface unit 1170 may receive data from an external device, receive power to transfer to each element inside the optical device, or transmit data within the optical device to an external device. The interface unit 1170 may include any one or more of a wired/wireless headset port, an external charger port, a wired/wireless data port, a memory card port, a port connecting a device equipped with an identification module, and audio input/output (I/O) port, a video input/output (I/O) port, and an earphone port.

The optical device may include the controller 1180. The controller 1180 may control an overall operation of the optical device. The controller 1180 may perform related control and processing for voice call, data communication, video call, and the like. The controller 1180 may include a multimedia module 1181 for playing multimedia. The multimedia module 1181 may be provided in the controller 1180, or may be provided separately from the controller 1180. The controller 1180 may perform a pattern recognition processing for recognizing a writing input or a drawing input performed on a touch screen as text and an image, respectively.

The optical device may include the power supply unit 1190. The power supply unit 1190 may receive an external power source or an internal power source by a control of the controller 1180 to supply the power necessary for operating each element.

According to the embodiment, in order to realize OIS and AF functions of the camera module, instead of moving the conventional lens barrel, the image sensor is moved relative to the lens barrel in the X-axis, Y-axis, and Z-axis directions. Accordingly, the camera module according to the embodiment may remove a complicated spring structure for realizing the OIS and AF functions, thereby simplifying a structure. In addition, the structure that is more stable than the existing one may be formed by moving the image sensor according to the embodiment relative to the lens barrel.

In addition, according to the embodiment, the terminal portion electrically connected to the image sensor has a spring structure and is disposed to be floated at a position not overlapped with the insulating layer in the vertical direction. Accordingly, the camera module may move the image sensor relative to the lens barrel while supporting the image sensor stably and elastically.

According to the above-described embodiment, a X-axis direction shift, a Y-axis direction shift, and a Z-axis-centered rotation corresponding to camera shake with respect to the image sensor may be performed, and accordingly, the camera shake correction with respect to the lens corresponding to the camera shake correction with respect to the image sensor may be performed together, thereby providing a more enhanced camera shake correction function.

In addition, according to the embodiment, it is possible to reduce a total height of the camera device by embedding electrical elements required for a camera circuit by utilizing an internal space of the second actuator for moving the image sensor relative to the lens barrel.

Further, according to the embodiment, a camera assembly process may be simplified by integrating and fusing components of the camera circuit and components of the second actuator.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

I claim:

1. An image sensor driving apparatus comprising:
a fixed portion including a first substrate;
an elastic member disposed on the first substrate; and
an image sensor moving portion disposed on the elastic member;
wherein the elastic member includes:
a first insulating portion including a first open region;
a second insulating portion spaced apart from the first insulating portion with a second open region interposed therebetween; and an elastic connection portion disposed to connect the first insulating portion and the second insulating portion and electrically connecting the fixed portion and the moving portion;

wherein the elastic connection portion electrically connects the fixed portion and the moving portion, wherein the elastic connection portion includes a plurality of elastic connection lines including a first lead pattern connected to the first insulating portion, a second lead pattern connected to the second connection portion, and a connection pattern connecting the first lead pattern and the second lead pattern, and wherein the connection pattern includes a portion disposed on the second open region and not overlapping with the first insulating portion and the second insulating portion in a thickness direction.

2. The image sensor driving apparatus of claim 1, wherein the elastic member includes a support plate supporting the first insulating portion and the second insulating portion.

3. The image sensor driving apparatus of claim 2, wherein the support plate includes the same metal as the elastic connection portion.

4. The image sensor driving apparatus of claim 3, wherein the first lead pattern of at least one of the plurality of elastic connection lines is disposed on a first side region of the first insulating portion, and the second lead pattern is disposed on a second side region of the second insulating portion that does not correspond to the first side region.

5. The image sensor driving apparatus of claim 3, wherein the connection pattern is bent at least twice.

6. The image sensor driving apparatus of claim 3, wherein each of the plurality of elastic connection lines includes a bending region between the corner region between the first insulating portion and the second insulating portion, and wherein an insulating member connects each of the bending regions.

7. The image sensor driving apparatus of claim 2, wherein the support plate includes:
a first support portion disposed on the first insulating portion and spaced apart from the first lead pattern;
a second support portion disposed on the second insulating portion and spaced apart from the second lead pattern; and
a third support portion disposed on the second open region to connect between the first support portion and the second support portion and spaced apart from the connection pattern.

8. The image sensor driving apparatus of claim 7, wherein the second support portion includes:
a second-first support part disposed on the second insulating portion; and
a second-second support part extending from the second-first support part and disposed outside the second insulating portion and not in contact with the second insulating portion;
wherein the second-second support part includes at least one coupling hole.

9. The image sensor driving apparatus of claim 1, wherein the image sensor moving portion includes:
a second substrate having an opening formed in a central region; and
a coil disposed on the second substrate.

10. The image sensor driving apparatus of claim 9, wherein the image sensor moving portion includes:
a third substrate disposed under the second substrate and having a terminal portion and an opening formed in a central region.

11. The image sensor driving apparatus of claim 1, wherein the moving portion includes a first driving portion, and
wherein the fixed portion includes a base, a holder coupled to the base, and a second driving portion disposed to correspond to the first driving portion.

12. The image sensor driving apparatus of claim 11, wherein the fixed portion includes a damping plate coupled to the holder, and
wherein a wire is connected between the damping plate and the moving portion.

13. The image sensor driving apparatus of claim 1, wherein the first lead pattern includes a plurality of first lead patterns,
wherein the second lead pattern includes a plurality of second lead patterns,
wherein the plurality of first lead patterns are disposed on the first insulating portion in a first direction, and
wherein the plurality of second lead patterns are disposed on the second insulating portion in a second direction orthogonal to the first direction.

14. The image sensor driving apparatus of claim 1, wherein a length of the connection pattern has a range of 1.5 to 20 times a linear distance between the first lead pattern portion and the second lead pattern.

15. The image sensor driving apparatus of claim 1, wherein the connection pattern does not contact the first insulating portion and the second insulating portion on the second open region.

16. The image sensor driving apparatus of claim 1, wherein the first lead pattern includes:
a first-first pattern part disposed on the first insulating portion; and
a first-second pattern part extending from the first-first pattern part toward the first open region and not overlapping the first insulating portion in the thickness direction.

17. The image sensor driving apparatus of claim 16, wherein the first-second pattern part does not contact the first and second insulating portions.

18. The image sensor driving apparatus of claim 1, wherein the second lead pattern includes:
a second-first pattern part disposed on the second insulating portion; and
a second-second pattern portion extending outwardly from the second-first pattern part and not in contact with the second insulating portion.

19. The image sensor driving apparatus of claim 1, wherein the connection pattern includes one end connected to the first lead pattern and the other end connected to the second lead pattern, and
wherein a side surface of each of the one end and the other end includes a curved surface.

20. The image sensor driving apparatus of claim 19, wherein a curvature (R) of the side surface of each of the one end and the other end has a range between 30 and 100.

* * * * *